(12) United States Patent
Cheung

(10) Patent No.: US 9,735,032 B2
(45) Date of Patent: Aug. 15, 2017

(54) SYSTEM AND METHOD FOR MANUFACTURING A FABRICATED CARRIER

(71) Applicant: Enablink Technologies Limited, Tsuen Wan, Hong Kong (CN)

(72) Inventor: Ka Wa Cheung, Tuen Mun (CN)

(73) Assignee: ENABLINK TECHNOLOGIES LIMITED, Kowloon (HK)

( * ) Notice: Subject to any disclaimer, the term of this patent is extended or adjusted under 35 U.S.C. 154(b) by 0 days.

(21) Appl. No.: 14/561,493

(22) Filed: Dec. 5, 2014

(65) Prior Publication Data

US 2015/0162217 A1 Jun. 11, 2015

Related U.S. Application Data

(60) Provisional application No. 61/912,737, filed on Dec. 6, 2013.

(51) Int. Cl.
*H01L 23/495* (2006.01)
*H01L 21/48* (2006.01)
(Continued)

(52) U.S. Cl.
CPC ...... *H01L 21/4828* (2013.01); *H01L 21/4825* (2013.01); *H01L 21/4839* (2013.01); *H01L 21/4846* (2013.01); *H01L 21/4853* (2013.01); *H01L 21/4871* (2013.01); *H01L 21/563* (2013.01); *H01L 21/565* (2013.01); *H01L 23/13* (2013.01); *H01L 23/49503* (2013.01); *H01L 23/49811* (2013.01); *H01L 23/49827* (2013.01); *H01L 23/5389* (2013.01);
(Continued)

(58) Field of Classification Search
CPC . H01L 2924/15311; H01L 2924/15321; H01L 2924/15331; H01L 23/485; H01L 23/498; H01L 23/49811; H01L 23/49816
See application file for complete search history.

(56) References Cited

U.S. PATENT DOCUMENTS 5,729,437 A * 3/1998 Hashimoto .................. 361/760
6,172,419 B1 * 1/2001 Kinsman ............... H01L 21/568
257/701

(Continued)

FOREIGN PATENT DOCUMENTS

EP 1 271 644 A1 1/2003

OTHER PUBLICATIONS

Official Communication issued in corresponding European Patent Application No. 14196621.8, mailed on Apr. 30, 2015.
(Continued)

*Primary Examiner* — Selim Ahmed
*Assistant Examiner* — Evan Clinton
(74) *Attorney, Agent, or Firm* — Keating and Bennett, LLP

(57) ABSTRACT

A method of fabricating a BGA carrier, the method comprising combining a conductive portion and a molded dielectric portion, the dielectric portion having a top surface, a bottom surface and an inner surface, the inner surface intersecting said top surface and said bottom surface, the inner surface forming a cavity for receiving a semiconductor die; selectively bonding the semiconductor die to a top surface of the conductive portion; selectively etching part of the conductive portion; and applying solder resist to a bottom surface of the conductive portion.

26 Claims, 29 Drawing Sheets

(51) Int. Cl.
*H01L 23/538* (2006.01)
*H01L 23/00* (2006.01)
*H01L 23/13* (2006.01)
*H01L 23/498* (2006.01)
*H01L 25/10* (2006.01)
*H01L 21/56* (2006.01)

(52) U.S. Cl.
CPC .............. *H01L 24/19* (2013.01); *H01L 24/96* (2013.01); *H01L 24/97* (2013.01); *H01L 25/105* (2013.01); H01L 21/568 (2013.01); H01L 23/49816 (2013.01); H01L 2224/12105 (2013.01); H01L 2224/131 (2013.01); H01L 2224/1329 (2013.01); H01L 2224/13082 (2013.01); H01L 2224/13147 (2013.01); H01L 2224/13339 (2013.01); H01L 2224/16225 (2013.01); H01L 2224/2929 (2013.01); H01L 2224/29387 (2013.01); H01L 2224/32225 (2013.01); H01L 2224/73204 (2013.01); H01L 2224/81203 (2013.01); H01L 2224/81207 (2013.01); H01L 2224/81815 (2013.01); H01L 2224/92125 (2013.01); H01L 2224/97 (2013.01); H01L 2225/1023 (2013.01); H01L 2225/1035 (2013.01); H01L 2225/1058 (2013.01); H01L 2924/15151 (2013.01); H01L 2924/15153 (2013.01); H01L 2924/15311 (2013.01); H01L 2924/181 (2013.01); H01L 2924/18161 (2013.01); H01L 2924/18162 (2013.01)

(56) References Cited

U.S. PATENT DOCUMENTS

| | | | |
|---|---|---|---|
| 6,444,498 B1* | 9/2002 | Huang et al. | 438/126 |
| 6,448,506 B1* | 9/2002 | Glenn | H01L 23/3128 174/260 |
| 6,528,869 B1 | 3/2003 | Glenn et al. | |
| 6,936,922 B1* | 8/2005 | Park et al. | 257/737 |
| 7,064,012 B1 | 6/2006 | Lin | |
| 8,432,022 B1* | 4/2013 | Huemoeller et al. | 257/659 |
| 2004/0175582 A1 | 9/2004 | Brenneman et al. | |
| 2009/0102050 A1 | 4/2009 | Hsu | |
| 2010/0044845 A1 | 2/2010 | Funaya et al. | |
| 2010/0288541 A1 | 11/2010 | Appelt et al. | |
| 2012/0020026 A1 | 1/2012 | Oganesian et al. | |
| 2012/0085572 A1 | 4/2012 | Sakai | |
| 2012/0104623 A1* | 5/2012 | Pagaila et al. | 257/774 |
| 2012/0170887 A1* | 7/2012 | Yang et al. | 385/14 |

OTHER PUBLICATIONS

Official Communication issued in related European Patent Application No. 14196619.2, mailed on Jul. 9, 2015.
Official Communication issued in related European Patent Application No. 14196620.0, mailed on Apr. 30, 2015.
Cheung; "System and Method for Manufacturing a Cavity Down Fabricated Carrier"; U.S. Appl. No. 14/561,499, filed Dec. 5, 2014.
Cheung; "System and Method for Manufacturing a Fabricated Carrier"; U.S. Appl. No. 14/561,501, filed Dec. 5, 2014.

* cited by examiner

SYSTEM AND METHOD FOR MANUFACTURING A FABRICATED CARRIER

RELATED APPLICATIONS

This application claims priority from U.S. patent application 61/912,737, filed Dec. 6, 2014. Priority is claimed to this earlier filed application and the contents of this earlier filed application are incorporated herein, in its entirety, by reference.

FIELD OF INVENTION

The present invention relates generally to integrated circuit packaging and more particularly to a system and method for fabricating a die down flip chip carrier.

BACKGROUND

Various processes exist for forming a fabricated carrier. For example, fabrication can be done by means of fabricating a polyimide carrier laminated with metal foil with the aid of an adhesive layer, followed by patterning the metal and selectively plating the metal portion followed by laminating the polyimide carrier onto a thick metal piece where there is a partially etched cavity aligning with the opening of the polyimide carrier to form the die receptacle. This is not a cost effective way to make such a carrier since the polyimide is relatively expensive. Moreover, polyimide is relatively thin, and in order to create a deep enough receptacle to receive a semiconductor device, a relatively thick metal piece with partially etched cavity is needed and therefore additional etching step is needed.

SUMMARY

It is an object to provide a novel die down flip chip carrier and method of manufacturing thereof that obviates and mitigates at least one of the above-identified disadvantages of the prior art.

These, together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF DRAWINGS

FIGS. 4(a)-(c), shows a repeating unit of the panel in accordance with an implementation;

FIGS. 5(a)-(c), shows a repeating unit of the panel in accordance with an implementation;

FIGS. 7(a)-(c), shows a repeating unit of the panel in accordance with an implementation;

FIGS. 8(a)-(c), shows a repeating unit of the panel in accordance with an implementation;

FIGS. 9(a)-(c), shows a repeating unit of the panel in accordance with an implementation;

FIGS. 10(a)-(c), shows a repeating unit of the panel in accordance with an implementation;

FIGS. 11(a)-(c), shows a repeating unit of the panel in accordance with an implementation;

FIGS. 12(a)-(c), shows a repeating unit of the panel in accordance with an implementation;

FIGS. 13(a)-(c), shows a repeating unit of the panel in accordance with an implementation;

FIGS. 14(a)-(c), shows a repeating unit of the panel in accordance with an implementation;

FIGS. 15(a)-(c), shows a repeating unit of the panel in accordance with an implementation;

FIGS. 16(a)-(c), shows a repeating unit of the panel in accordance with an implementation;

FIGS. 17(a)-(c), shows a repeating unit of the panel in accordance with an implementation;

FIGS. 18(a)-(c), shows a repeating unit of the panel in accordance with an implementation;

FIGS. 19(a)-(c), shows a repeating unit of the panel in accordance with an implementation;

FIGS. 20(a)-(c), shows a repeating unit of the panel in accordance with an implementation;

FIGS. 22(a)-(c), shows a repeating unit of the panel in accordance with an implementation;

FIGS. 23(a)-(c), shows a repeating unit of the panel in accordance with an implementation;

FIGS. 24(a)-(c), shows a repeating unit of the panel in accordance with an implementation;

FIGS. 26(a)-(c), shows a repeating unit of the panel in accordance with an implementation;

FIGS. 27(a)-(c), shows a repeating unit of the panel in accordance with an implementation;

FIGS. 28(a)-(c), shows a repeating unit of the panel in accordance with an implementation; FIGS. 29(a)-(c), shows a repeating unit of the panel in accordance with an implementation;

DETAILED DESCRIPTION

Figure 1:
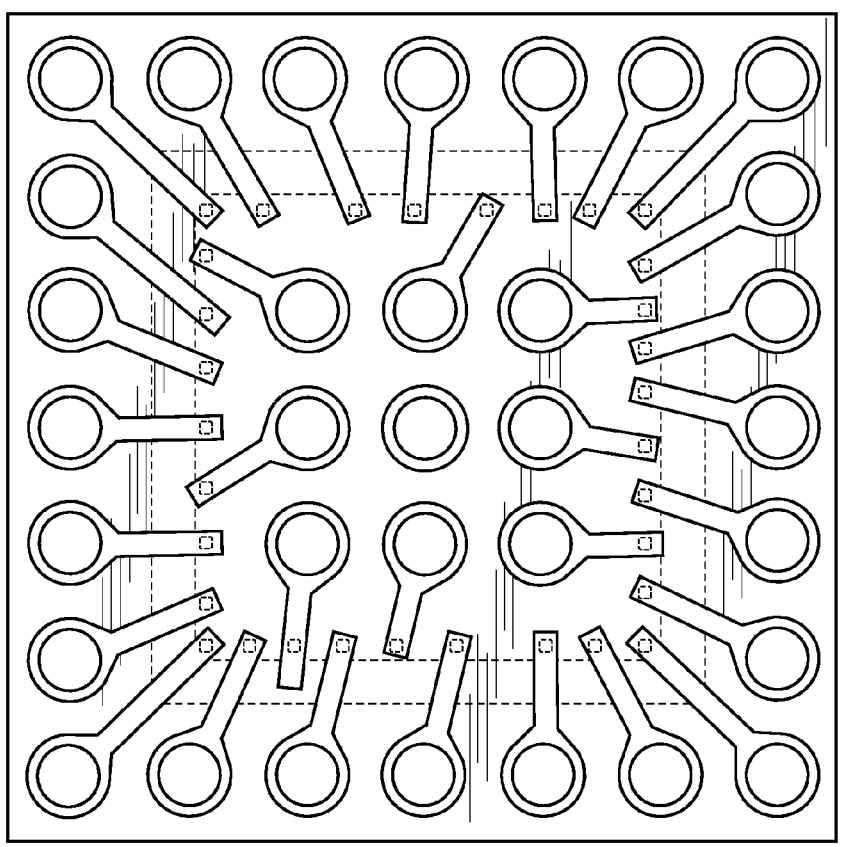
FIG. 1 shows a diagram of a ball grid array carrier in accordance with an implementation.
Figure 2:
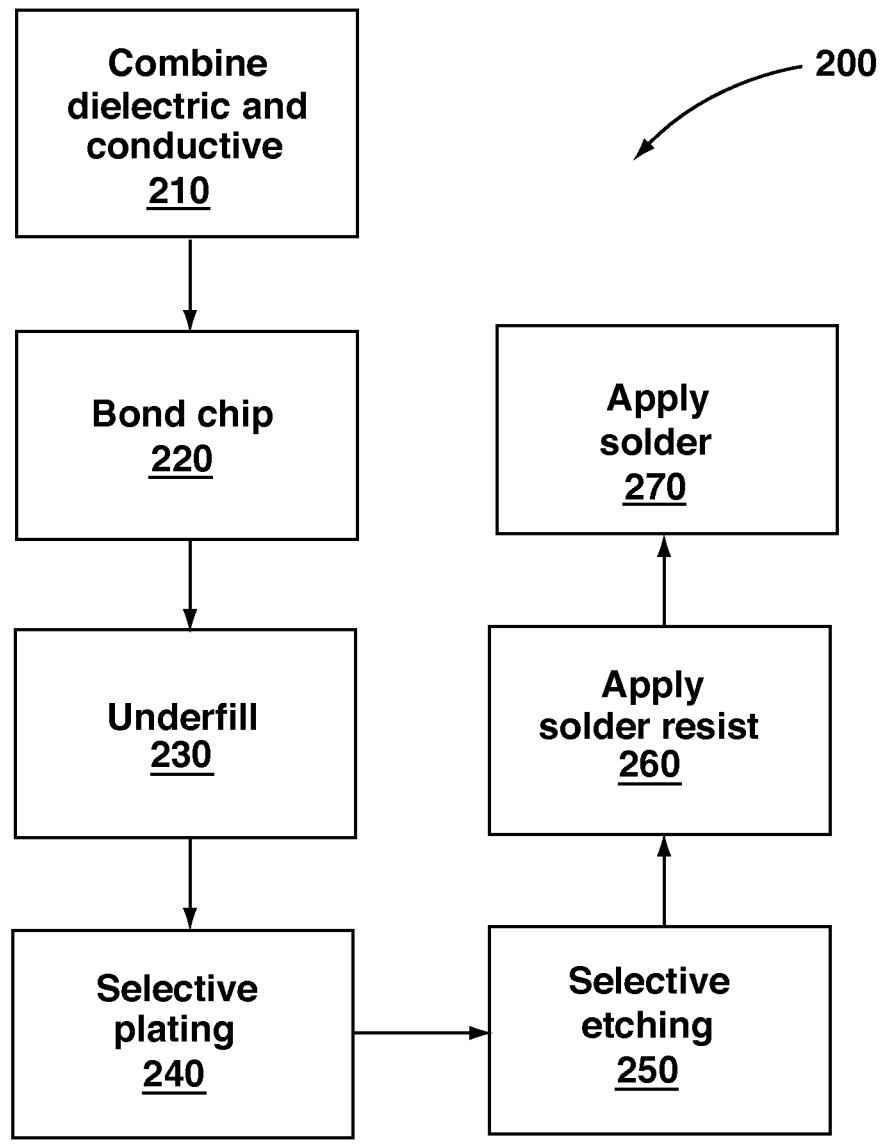
FIG. 2 shows a flow chart showing a method of ball grid carrier fabrication in accordance with an implementation.

FIG. 1 shows a bottom view of a die down flip chip carrier 125 in accordance with one implementation. Referring now to FIG. 2, a method of fabricating a die down flip chip carrier is indicated generally at 200. It is to be understood that method 200 can be varied, and need not be performed exactly as set forth herein, and that variations are within scope of a person of skill in the art.

Figure 3:
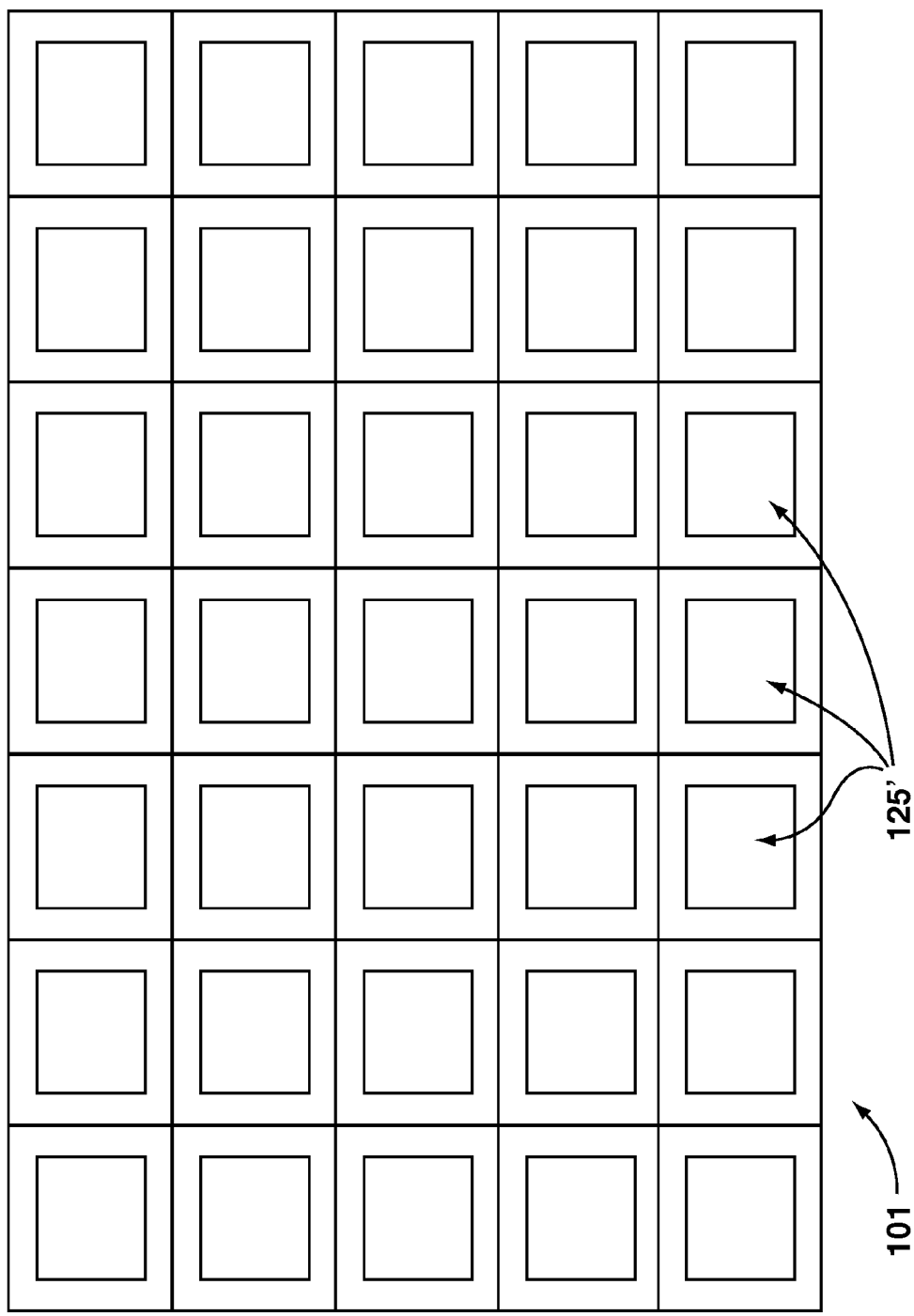
FIG. 3 shows a panel of carriers in accordance with an implementation

In some implementations, a pre-mold panel can be formed to manufacture one or more carriers 125. Referring now to FIG. 3, a top view of a pre-mold panel 101 is shown. Although rectangular in this example implementation, it will be understood by those of skill in the art that the panel 101 can take various shapes such as a strip, a circular wafer and others. The panel 101 contains a number of repeating units 125', which in this implementation are arranged in the form of a matrix, each repeating unit 125' being an incomplete carrier 125.

Figure 4:
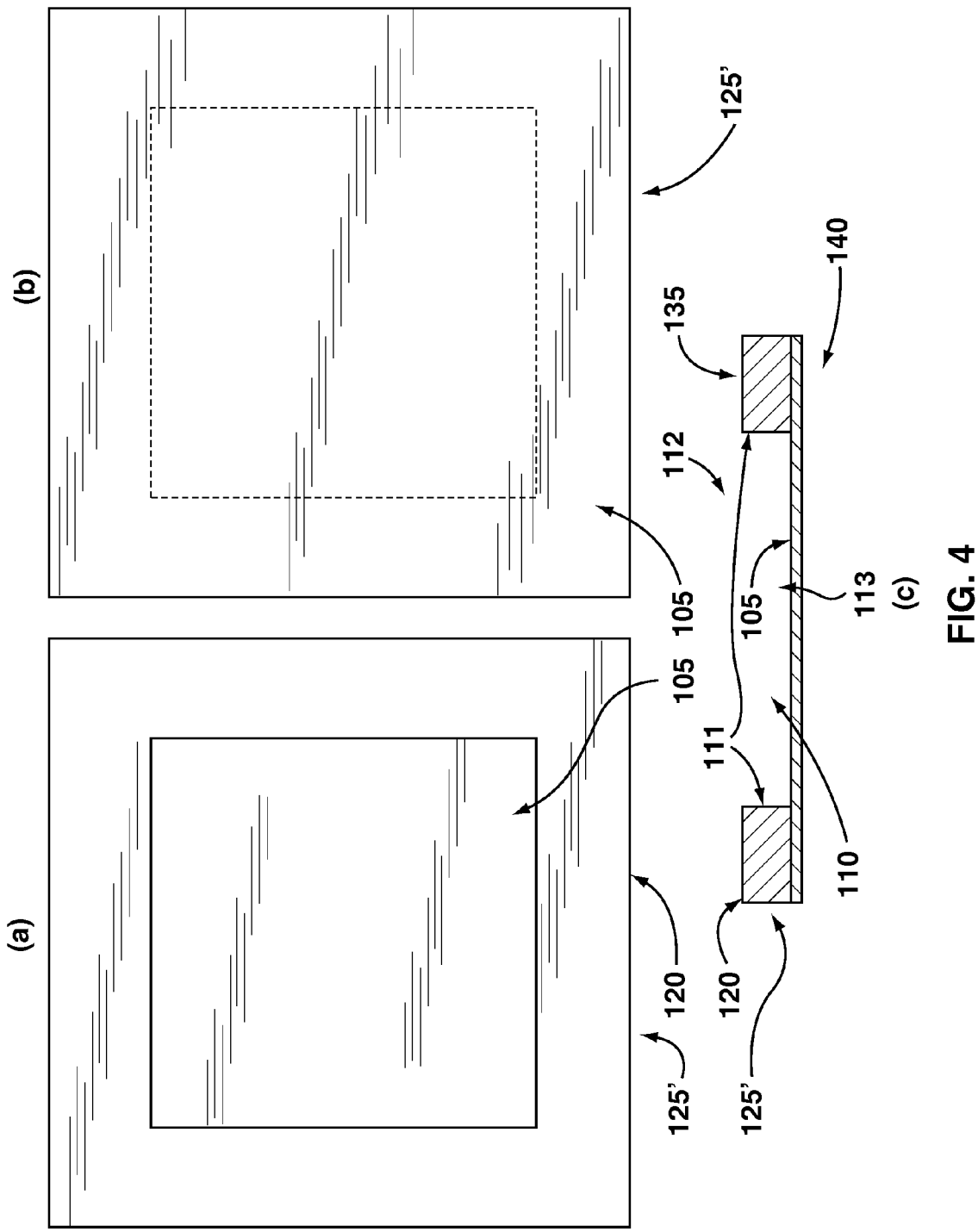
FIG. 4, comprising

Beginning with the method 200, at 210, a dielectric portion is combined with a conductive portion. Referring to FIG. 4, a conductive portion 105, which can be made of metal such as copper or chromium, can be combined with a dielectric portion 120 using various techniques. FIG. 4(a)

shows a top view of a repeating unit 125', FIG. 4(*b*) shows a bottom view of a repeating unit 125' and FIG. 4(*c*) shows a cross section of a repeating unit 125' having a top surface 135 and a bottom surface 140.

The dielectric portion 120 may be composed of a polymerized molding compound based, for example, on a binding material such as an epoxy and filled with inorganic fillers such as silicon dioxide or silicon carbide, or it may be any suitable plastic compound molded into a predetermined shape suitable to fabricate die down flip chip carriers. The dielectric portion 120 can be formed into any predetermined thickness through a molding process. An example thickness for dielectric portion 120 is approximately 0.1 mm. The dielectric portion 120 can be shaped so as to form a cavity or receptacle 110 in the middle such that the conductive portion 105 is exposed from both the top surface 135 and the bottom surface 140 of repeating unit 125' at the cavity 110.

Cavity 110 can be formed by an inner surface 111 of dielectric portion 120 that intersects the bottom surface 140 and the top surface 135 forming a top portal 112 and a bottom portal 113. In some implementations, such as the one shown in FIG. 3, inner surface 111 can be substantially orthogonal to the top and bottom surfaces. In other implementations, inner surface 111 can be angled in a manner that differs from the orthogonal, namely non-orthogonally, such that the top portal 112 and the bottom portal 113 can have different circumferential dimensions. For example, inner surface 111 may be at an angle greater than 90 degrees with respect to the bottom surface 135 allowing the bottom portal 113 to have a smaller circumference size with respect to the top portal 112. In such an example, the inner surface 111 would intersect the top surface 135 at an angle less than 90 degrees. The inner surface 111 can be arranged in any predetermined manner to allow forming portals of any predetermined circumferential shape as defined by the intersection of inner surface 111 with a top and/or a bottom surface. Examples of circumferential shapes include a square, a rectangle, a triangle, a circle or an irregular shape. Moreover, top portal 112 can be of a different circumferential shape from the bottom portal 113 by forming the inner surface 111 in a manner to allow such a different shape.

In some implementations, as shown in FIG. 4, conductive portion 105 can be a metal foil such as a copper foil. The thickness of the foil can vary, for example at 18 um, 10 um or thinner. In further implementations, molding compound forming the dielectric portion 120 can be molded through exposure to high temperatures in order to reduce viscosity, allowing the molding compound to be molded by a molding tool. In further implementations, dielectric portion 120 can be combined directly with the foil as the dielectric portion 120 can bind directly to the foil without the aid of an additional adhesive layer between the dielectric portion 120 and the foil. For example, in variations, a binding material included in the molding material can facilitate the direct binding of dielectric portion 120 and the foil.

Figure 5:
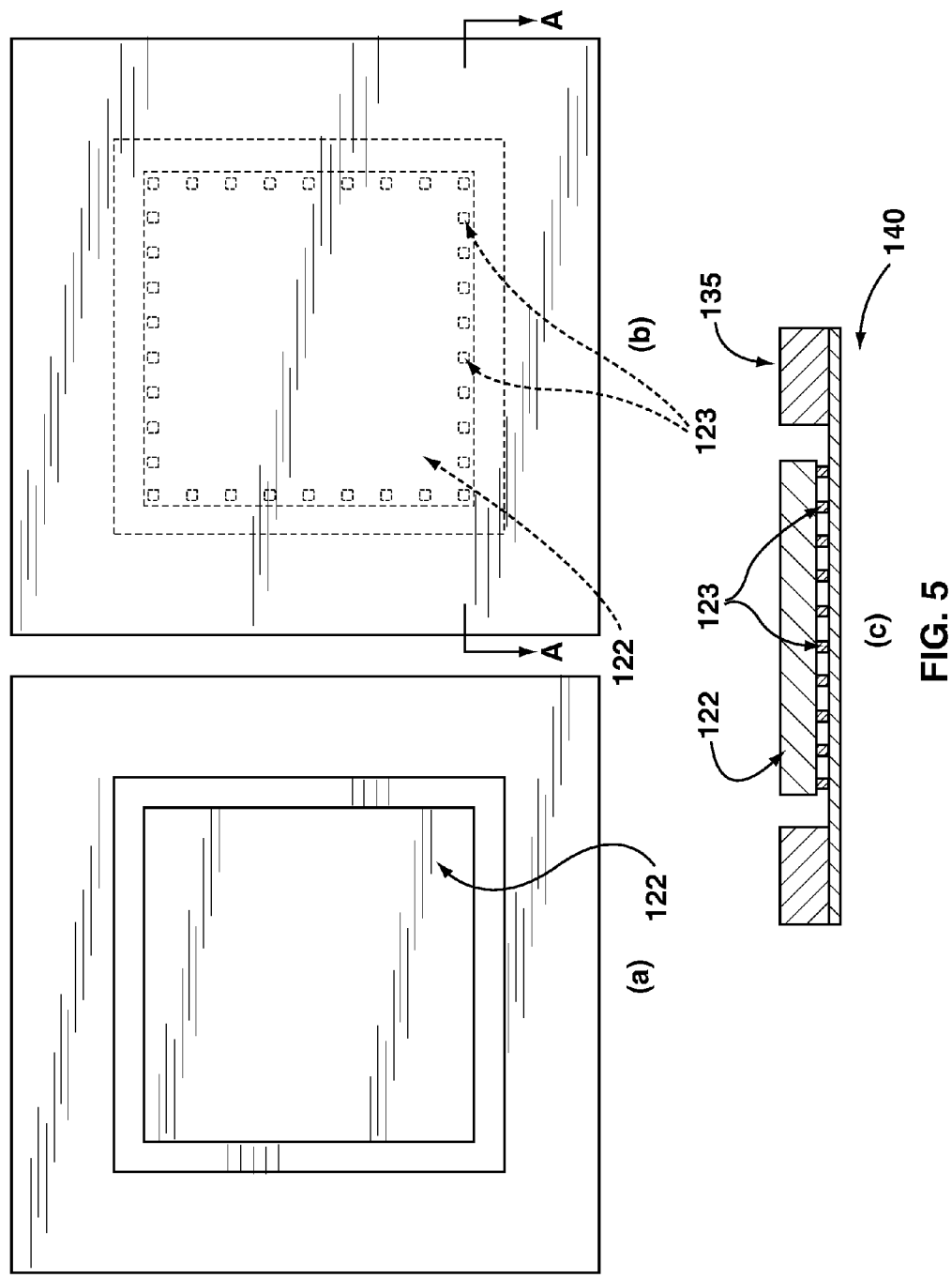
FIG. 5, comprising

Referring now to FIG. 5 and FIG. 2, at 220, a semiconductor chip, for example a flip chip die 122, is bonded onto the copper foil by methods known in the art such as thermal compression bonding, thermal sonic bonding, solder reflow, anisotropic conductive bonding and other methods that will be known to a person of skill in the art. In one implementation, as shown in FIG. 5, flip chip joints 123 are utilized. FIG. 5(*a*) shows a top view of a repeating unit 125', FIG. 5(*b*) shows a bottom view of a repeating unit 125' and FIG. 5(*c*) shows a cross section of a repeating unit 125' along line A-A, having a top surface 135 and a bottom surface 140.

Figure 6:
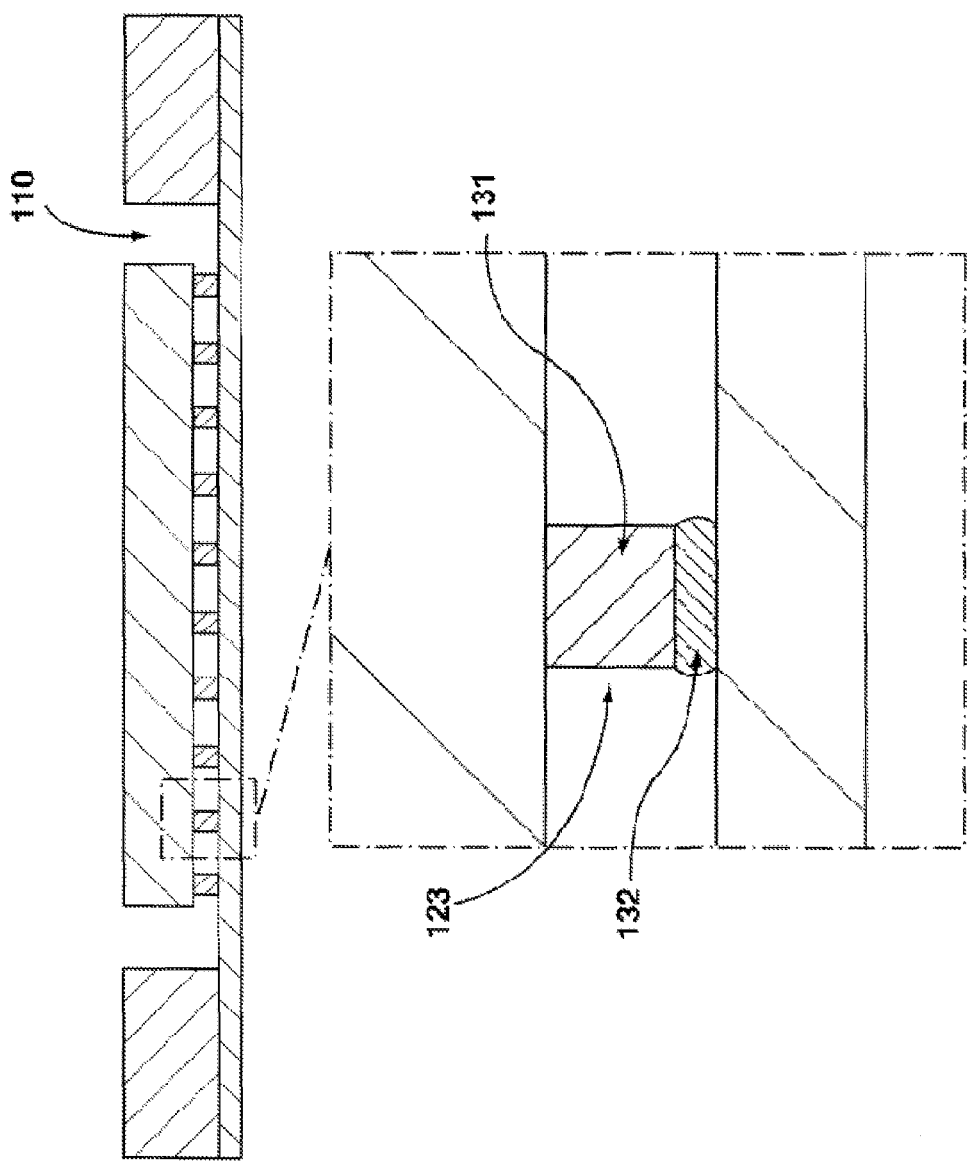
FIG. 6 shows cross-sectional view of a chip die bonded to a carrier.

FIG. 6 depicts a close up of a flip chip joint 123, in a cross-section, in accordance with an implementation, wherein flip chip joint 123 attaches to the top surface 135 of the conductive portion 105 with a conductive binding material 131 such as solder or silver epoxy. Between the conductive binding material 131 and the flip chip 122 is a bump 132, comprising a copper pillar bump, a copper stud bump or other that will be known to a person of skill.

Figure 7:
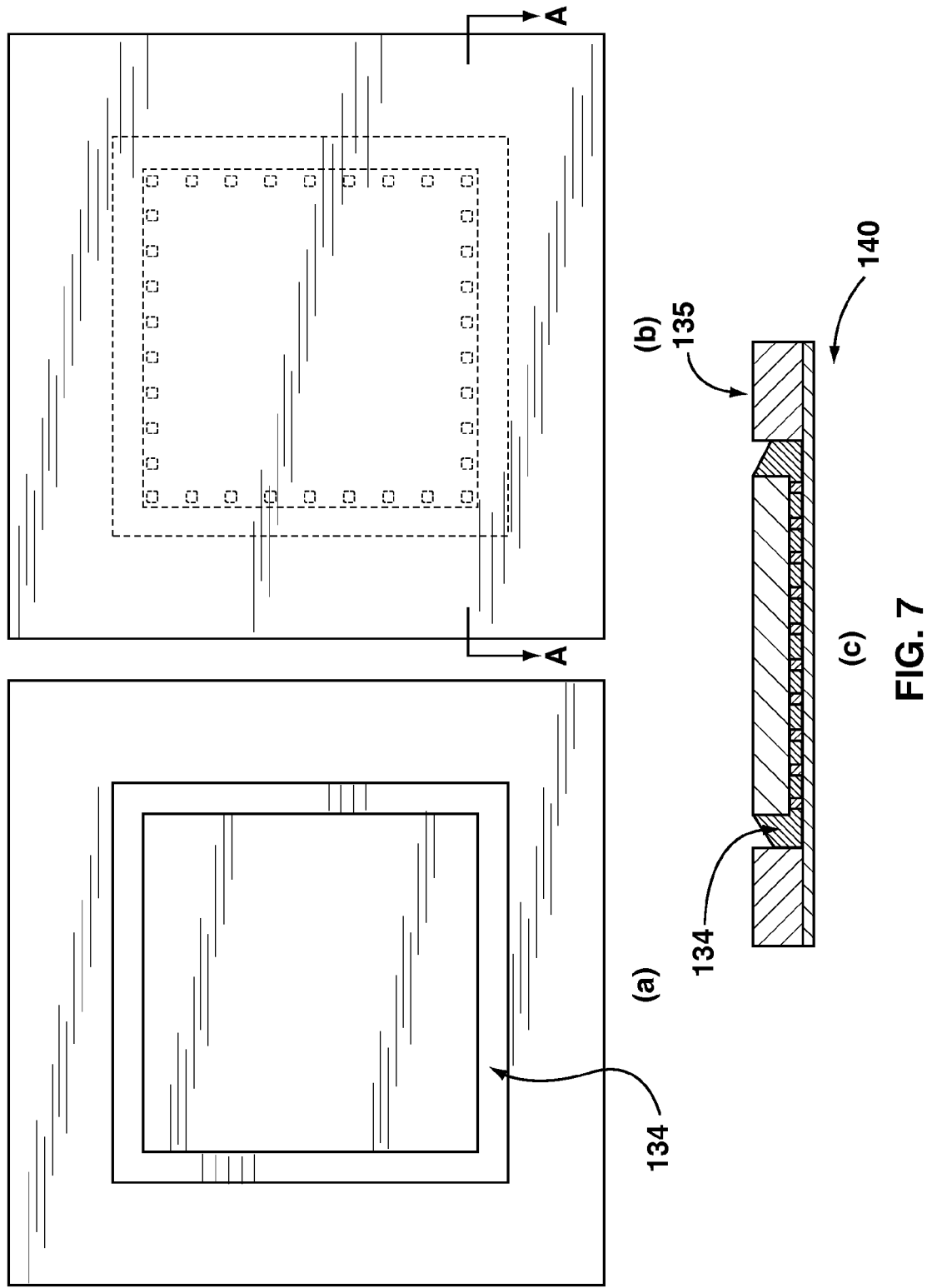
FIG. 7, comprising

Continuing with method 200, at 230 the gap between the die and the conductive portion is filled. As shown in FIG. 7, an underfill 134 can be inserted into part or all of the remaining portion of cavity 110 that is not occupied by the flip chip die 122 and the flip chip joints 123. In some implementations the underfill comprises non-conductive or insulating materials such liquid epoxy with very fine filler particle such as SiO2 and can be provided into cavity 110, between the die 122 and the conductive portion 105 using methods know in the art such as liquid dispensing. FIG. 7(*a*) shows a top view of a repeating unit 125', FIG. 7(*b*) shows a bottom view of a repeating unit 125' and FIG. 7(*c*) shows a cross section of a repeating unit 125' along line A-A having a top surface 135 and a bottom surface 140.

Figure 8:
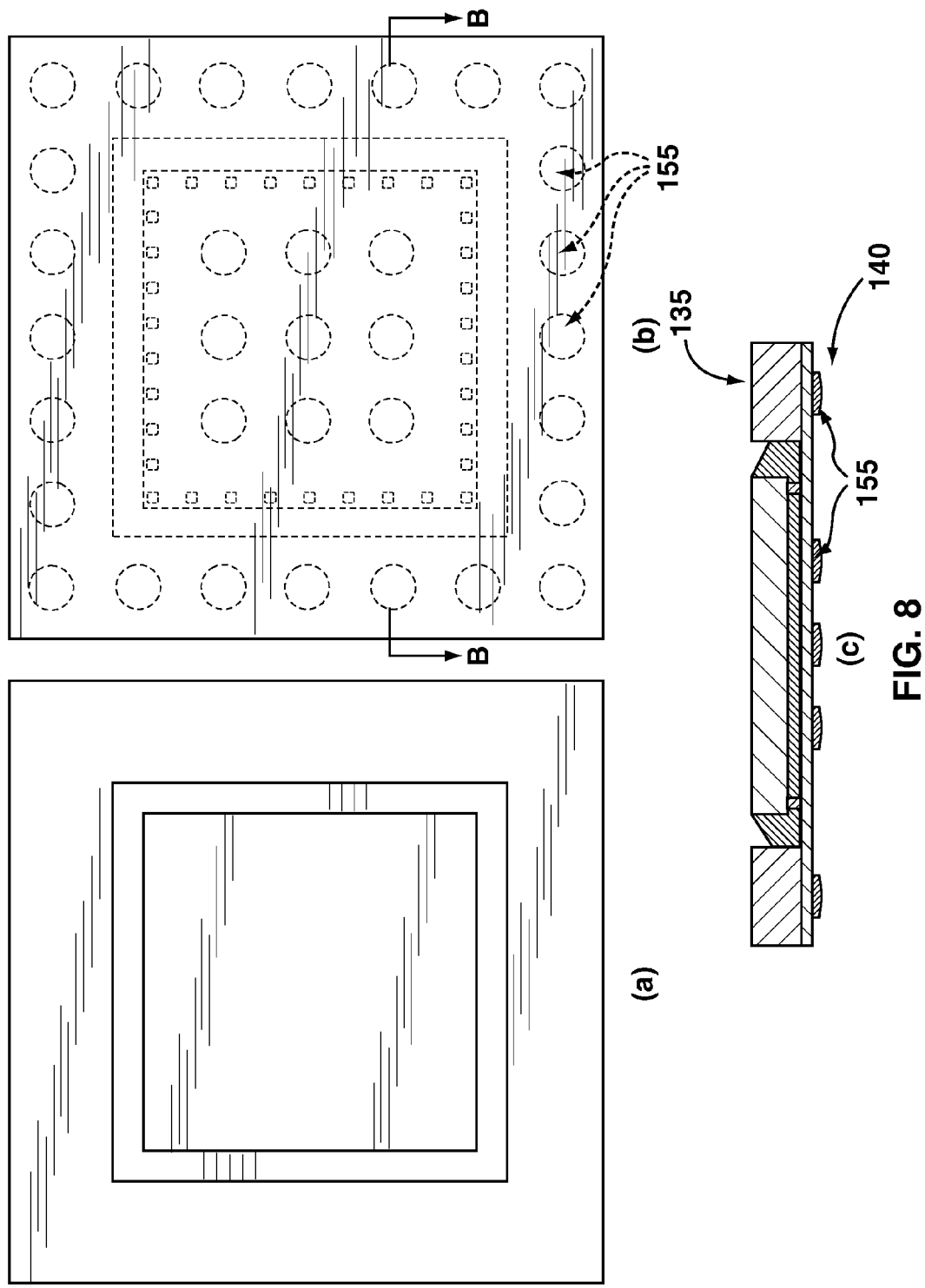
FIG. 8, comprising

Referring again to method 200 shown in FIG. 2, at 240, in some implementations, the exposed bottom surface 140 of conductive portion 105, namely the bottom surface of repeating unit 125', can be selectively plated as illustrated FIGS. 8 (*b*) and (*c*), where the selective plating is indicated at 155. Metal plating 155 can be selectively deposited on at least portions of conductive portion 105, which in the illustrated example is a metal foil. In some implementations, the plating 155 can be shaped to form ball grid array (BGA) pads. FIG. 8(*a*) shows a top view of a repeating unit 125', FIG. 8(*b*) shows a bottom view of a repeating unit 125' and FIG. 8(*c*) shows a cross section of a repeating unit 125' along line B-B, having a top surface 135 and a bottom surface 140. In some variations, in order to carry out selective plating, photo-imagable plating resist is applied to the bottom surface of the repeating unit 125'. The bottom surface 140 is then exposed to a predetermined or selected image pattern. Next, the plating resist is developed and the specified metal pattern is plated as indicated at 155. The metal used can be Ag, Ni/Au, Ni/Au/Pd as well as others that will be known to a person of skill. Finally, the plating resist is stripped away.

Figure 9:
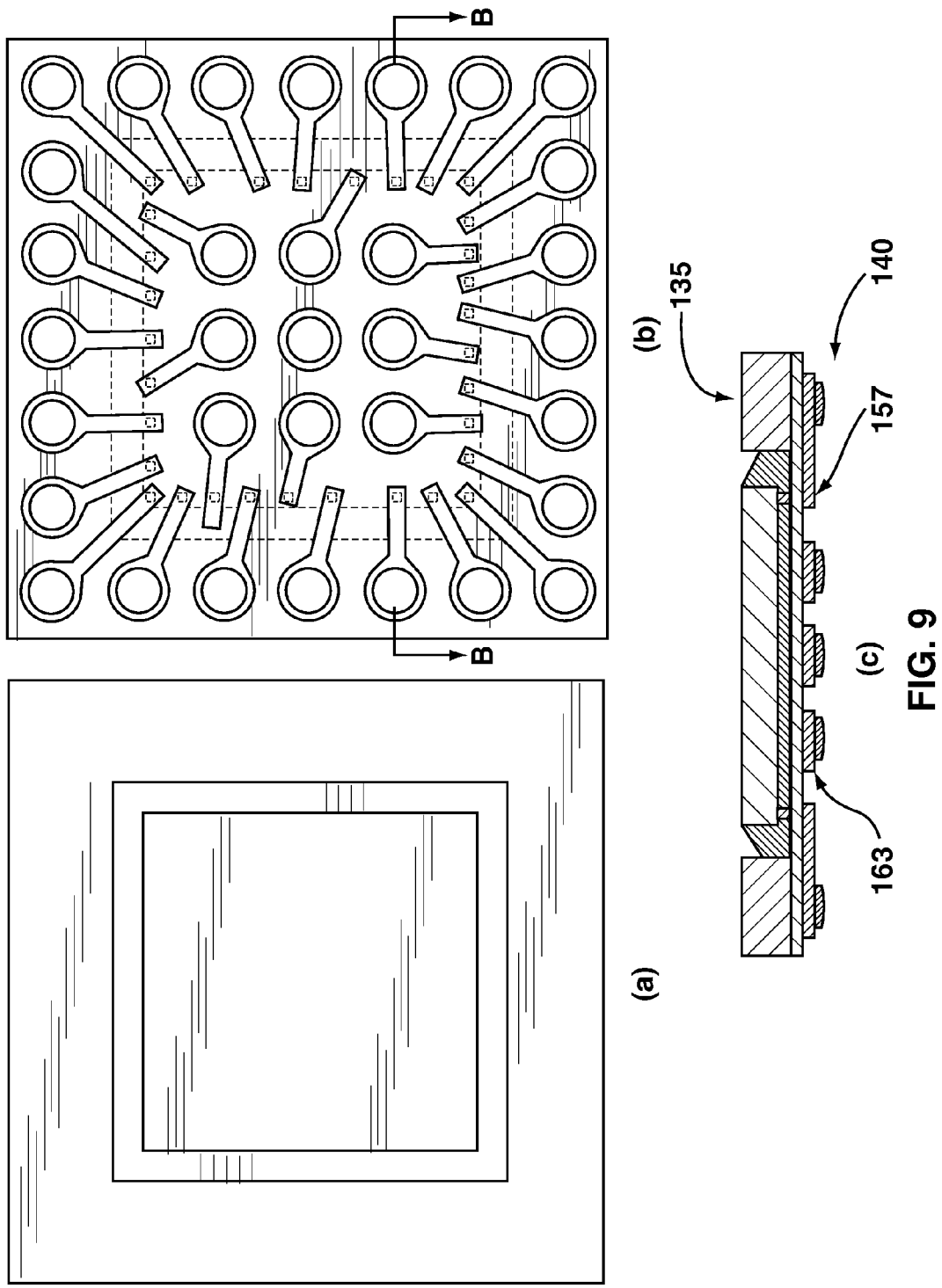
FIG. 9, comprising

Continuing with the method 200, at 250, at least some of conductive portion 105 is selectively etched away as indicated in FIG. 9. In some implementations predetermined pattern etching allows the formation connection paths 157 from the flip chip joints 123 to the BGA ball pads 163. FIG. 9(*a*) shows a top view of a repeating unit 125', FIG. 9(*b*) shows a bottom view of a repeating unit 125' and FIG. 9(*c*) shows a cross section of a repeating unit 125' along line B-B, having a top surface 135 and a bottom surface 140.

In some implementations, in order to carry out selectively etching of the conductive portion 105 in accordance with a predetermined pattern, photo imagable etching resist is applied to the bottom surface 140 and a selected image pattern is exposed. Then, the etching resist is developed and the metal pattern defined by the etching resist is protected and exposing the unwanted metal portion to chemical etching. Finally, the etching resist on the bottom surface 140 is stripped away.

Figure 10:
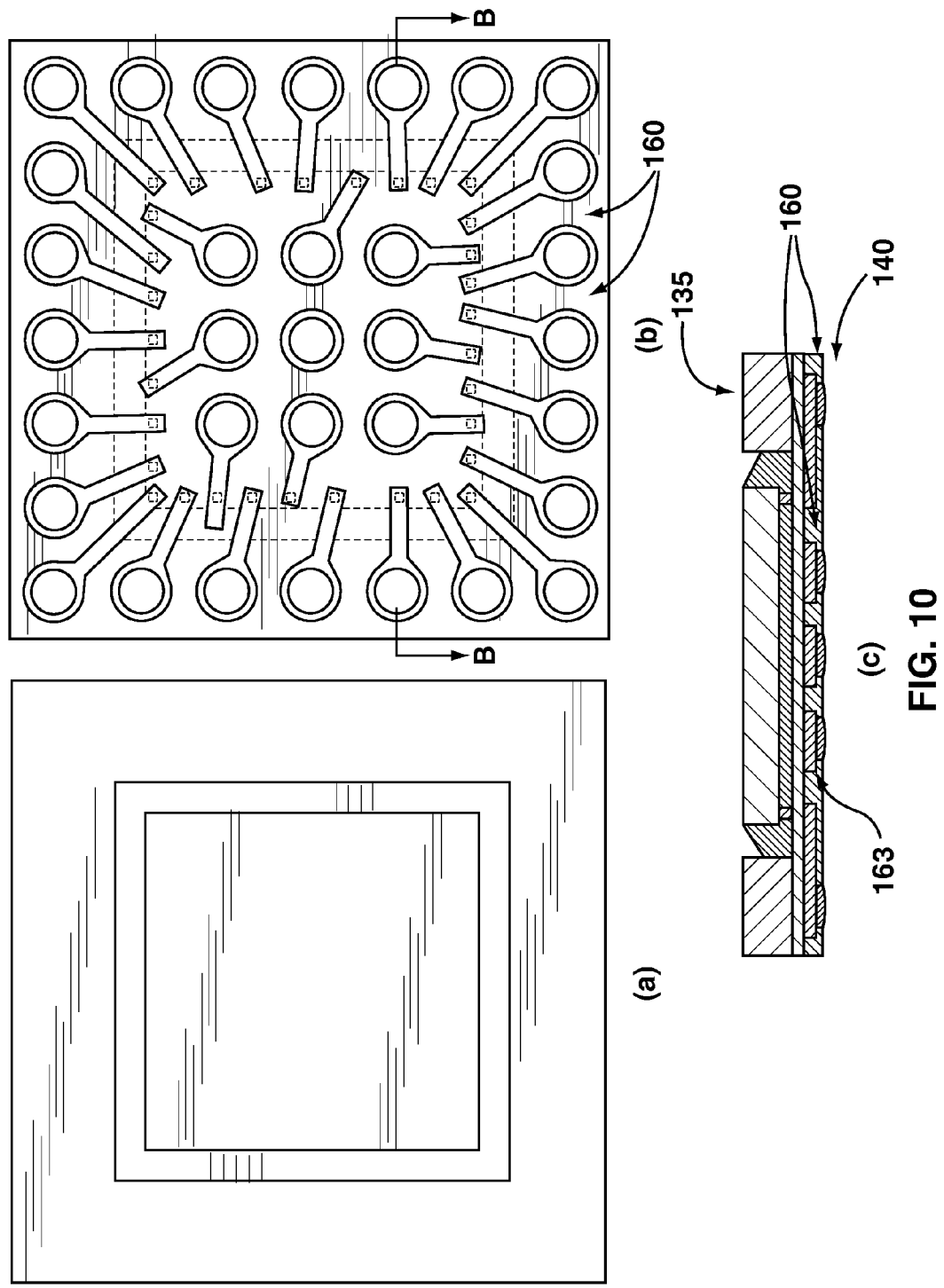
FIG. 10, comprising

At 260 of method 200, solder resist can be applied selectively in accordance with a predetermined shape or pattern to the bottom surface 140 using traditional methods. FIG. 10 shows solder resist as applied to the bottom surface 140 of repeating unit 125', indicated at 160. In some implementations, solder resist application is shaped such that areas of the conductive portion forming BGA pads 163 are left exposed at the bottom surface 140 of repeating unit 125', while the rest of the etched out metal pattern such as the connection paths are passivated.

Figure 11:
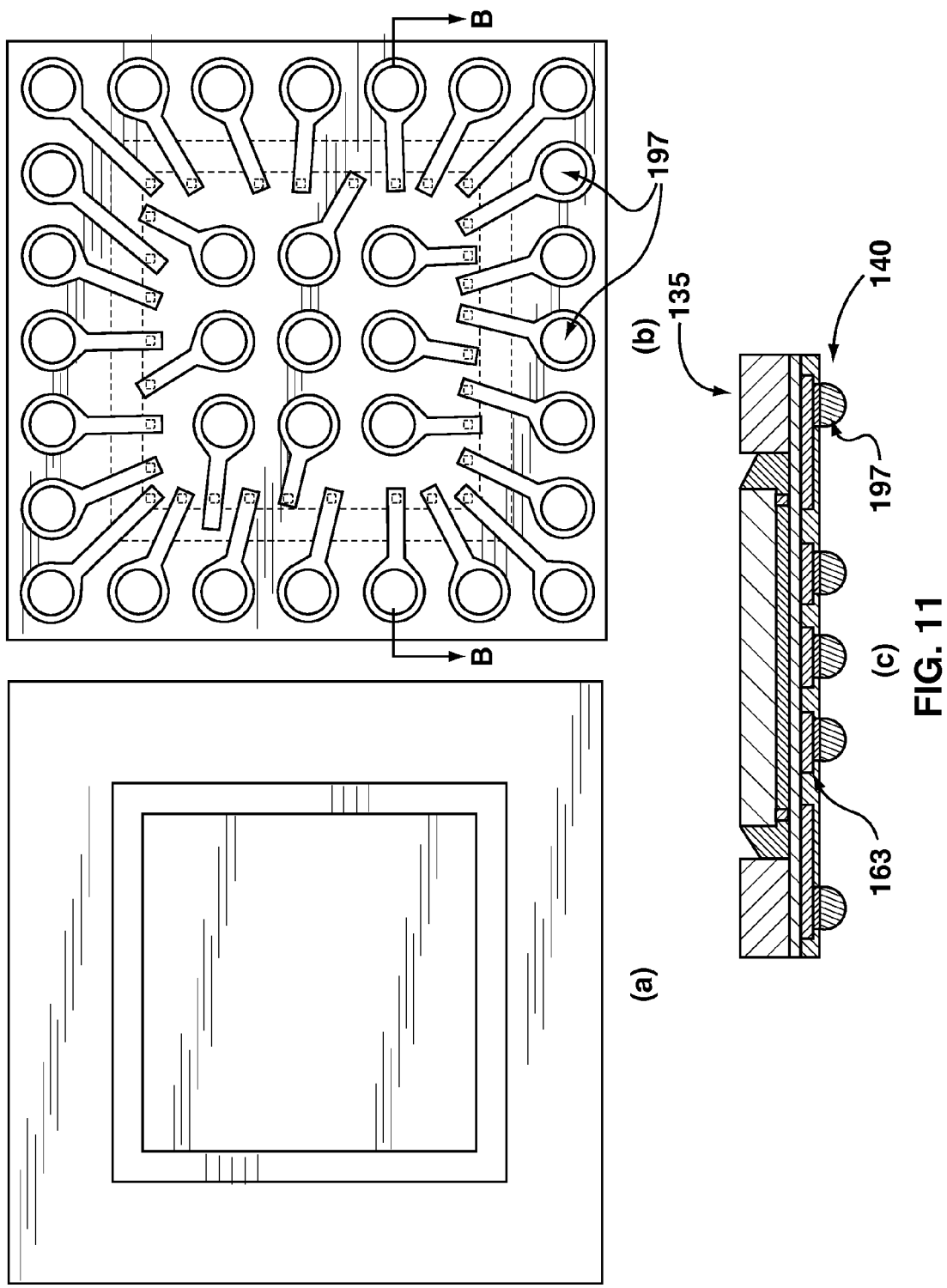
FIG. 11, comprising

At 270 of method 200, solder balls 197 can be attached to the exposed BGA pads 163 using flux followed by reflow, for example as shown in FIG. 11.

Figure 12:
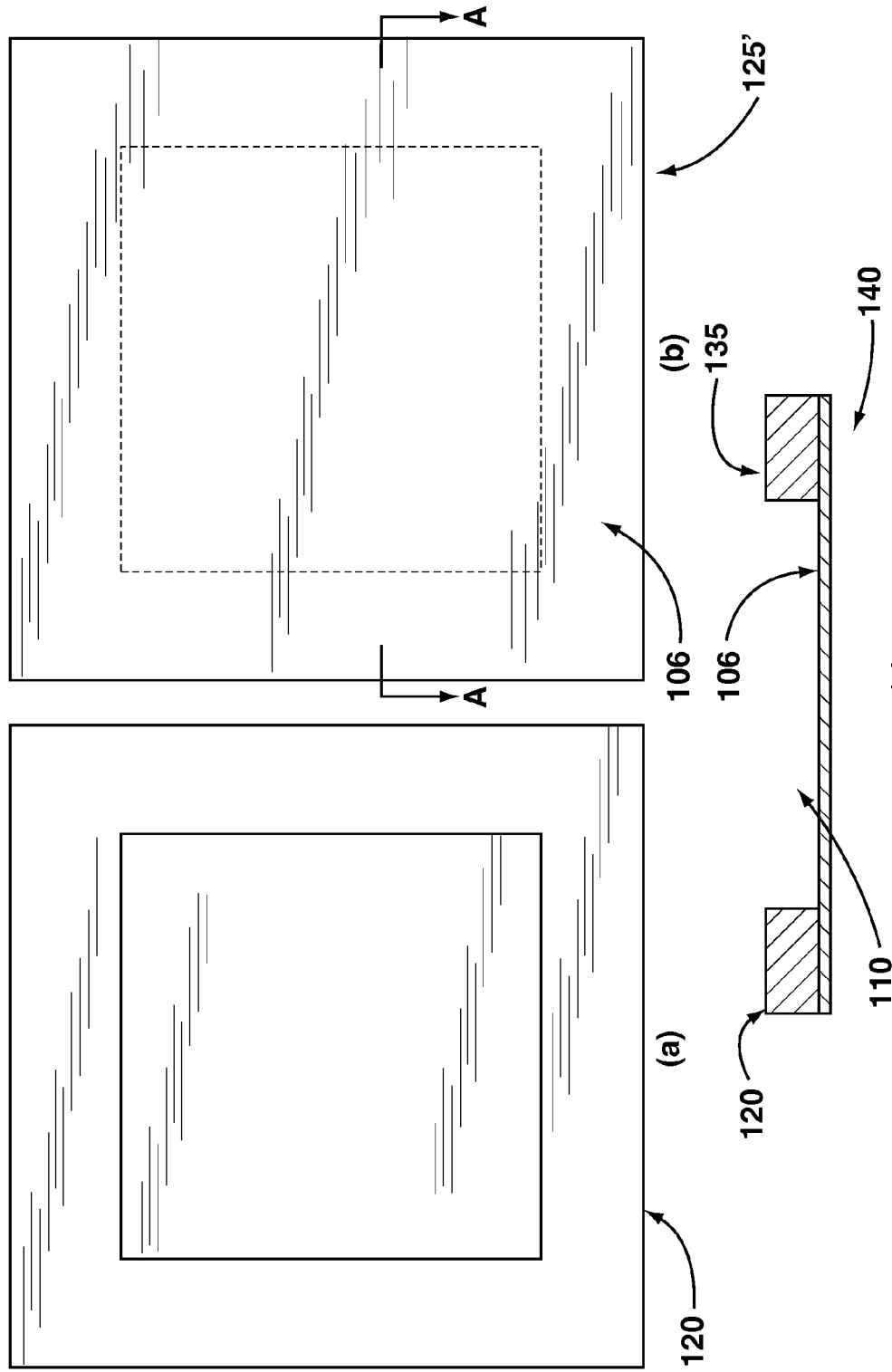
FIG. 12, comprising

Variations to method 200 are possible. In some variations, as shown in FIG. 12, at 210, the dielectric portion 120 of panel 101 may be combined by laminating, for example, with a high temperature resistant tape 106 or similar material. One side of tape 106 may include an adhesive layer facilitating the combination with the dielectric portion 120. FIG. 12(*a*) shows a top view of a repeating unit 125', FIG. 12(*b*) shows a bottom view of a repeating unit 125' and FIG. 12(*c*) shows a cross section of a repeating unit 125' along line A-A having a top surface 135 and a bottom surface 140.

Figure 13:
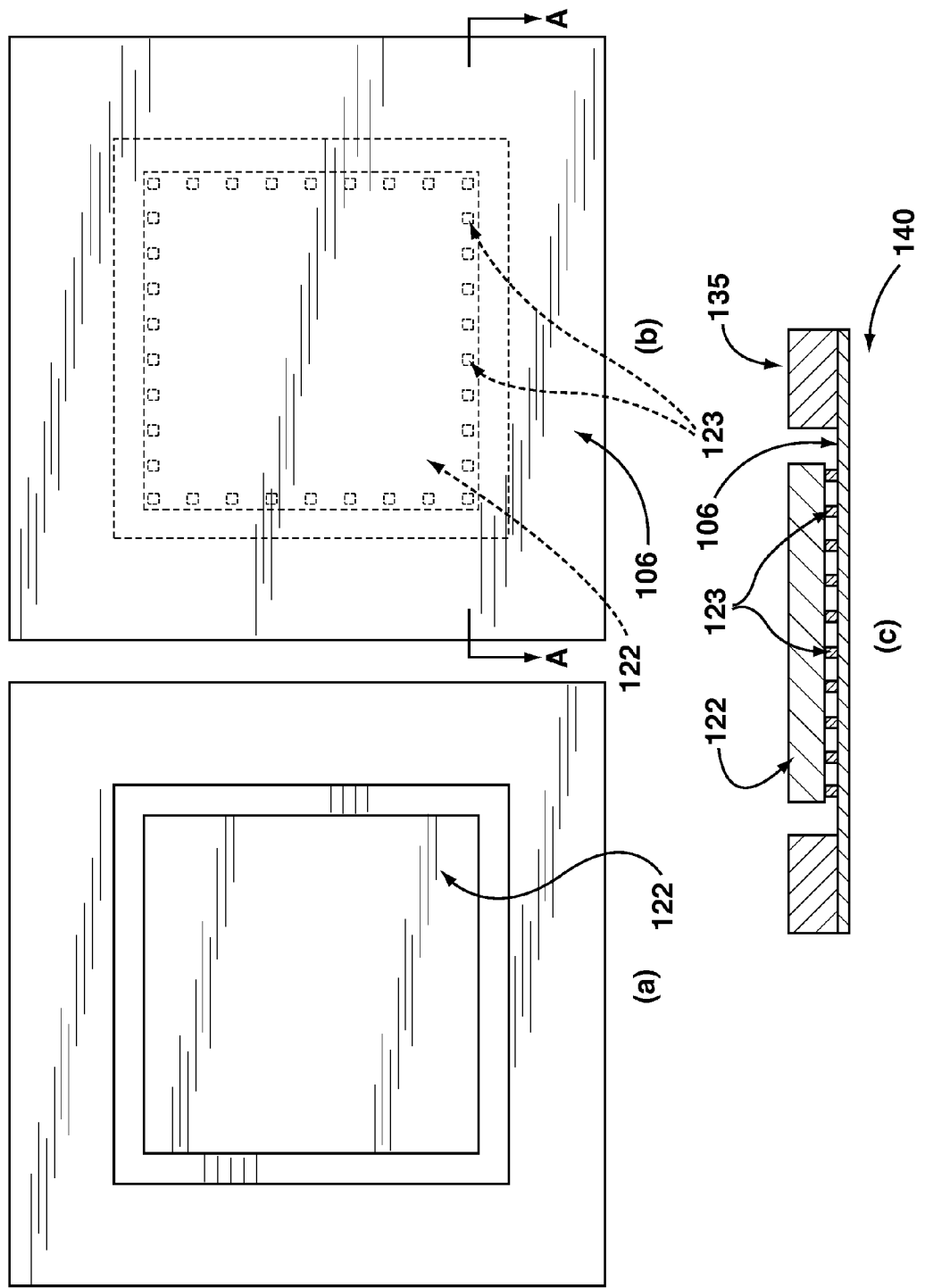
FIG. 13, comprising
Figure 26:
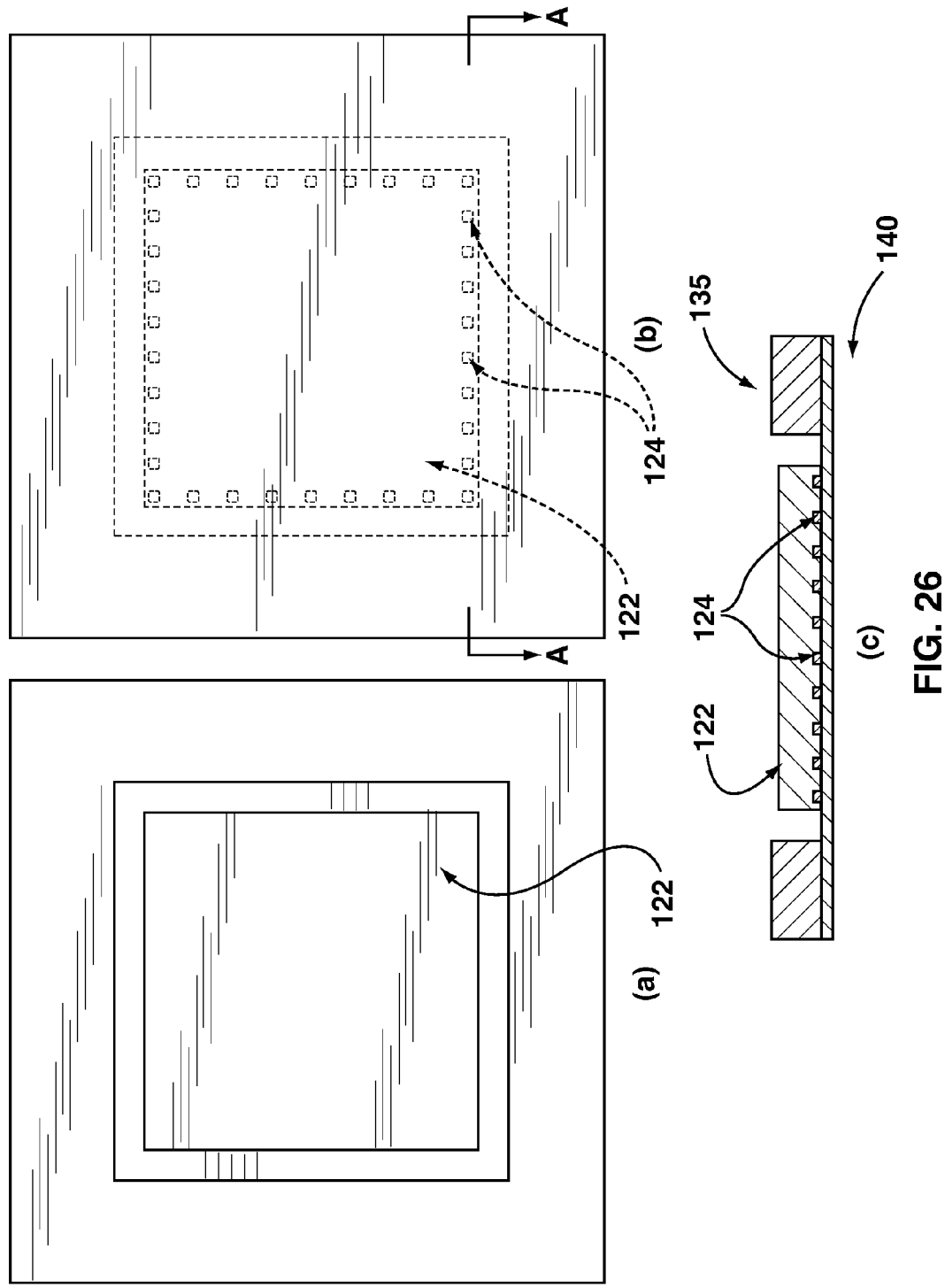
FIG. 26, comprising

Continuing with the illustrated embodiment, as indicated at FIG. 13, a flip chip die 122 is temporarily bonded onto the adhesive layer of the high temperature resistant tape 106. FIG. 13(*a*) shows a top view of a repeating unit 125', FIG. 13(*b*) shows a bottom view of a repeating unit 125' and FIG. 13(*c*) shows a cross section of a repeating unit 125' along line A-A, having a top surface 135 and a bottom surface 140. As indicated in FIGS. 13(*b*) and 13(*c*), die 122 can be attached, in some implementations, to tape 106 using flip chip joints 123 comprising copper pillar bumps, gold stud bumps or others that will known to those of skill in the art. In other implementations, as shown in FIG. 26, die 122 can be temporarily bonded to tape 106 directly. In such implementations, dies 122 can include wire bond pads 124 which can also be temporarily bonded onto tape 106.

Figure 14:
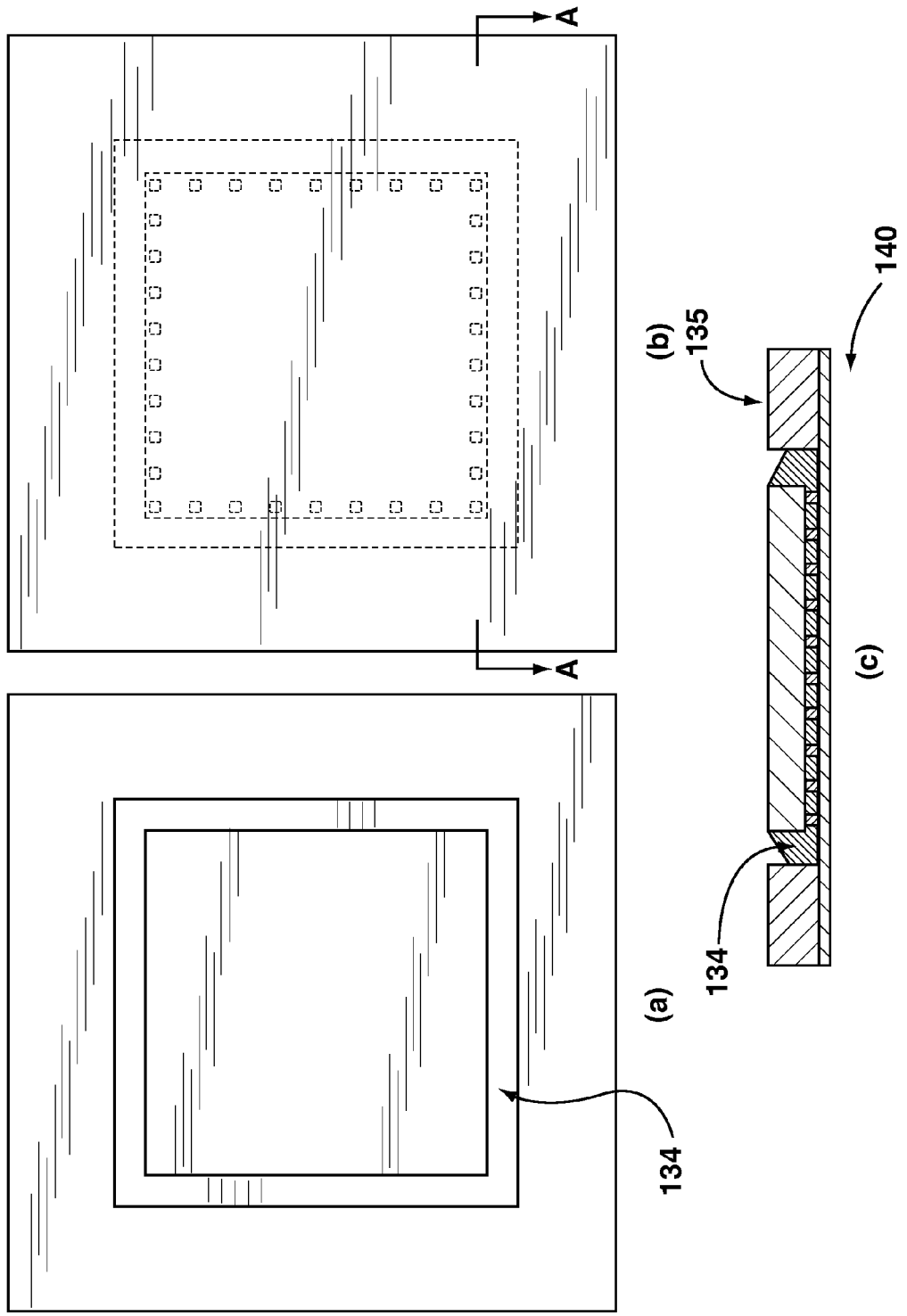
FIG. 14, comprising
Figure 27:
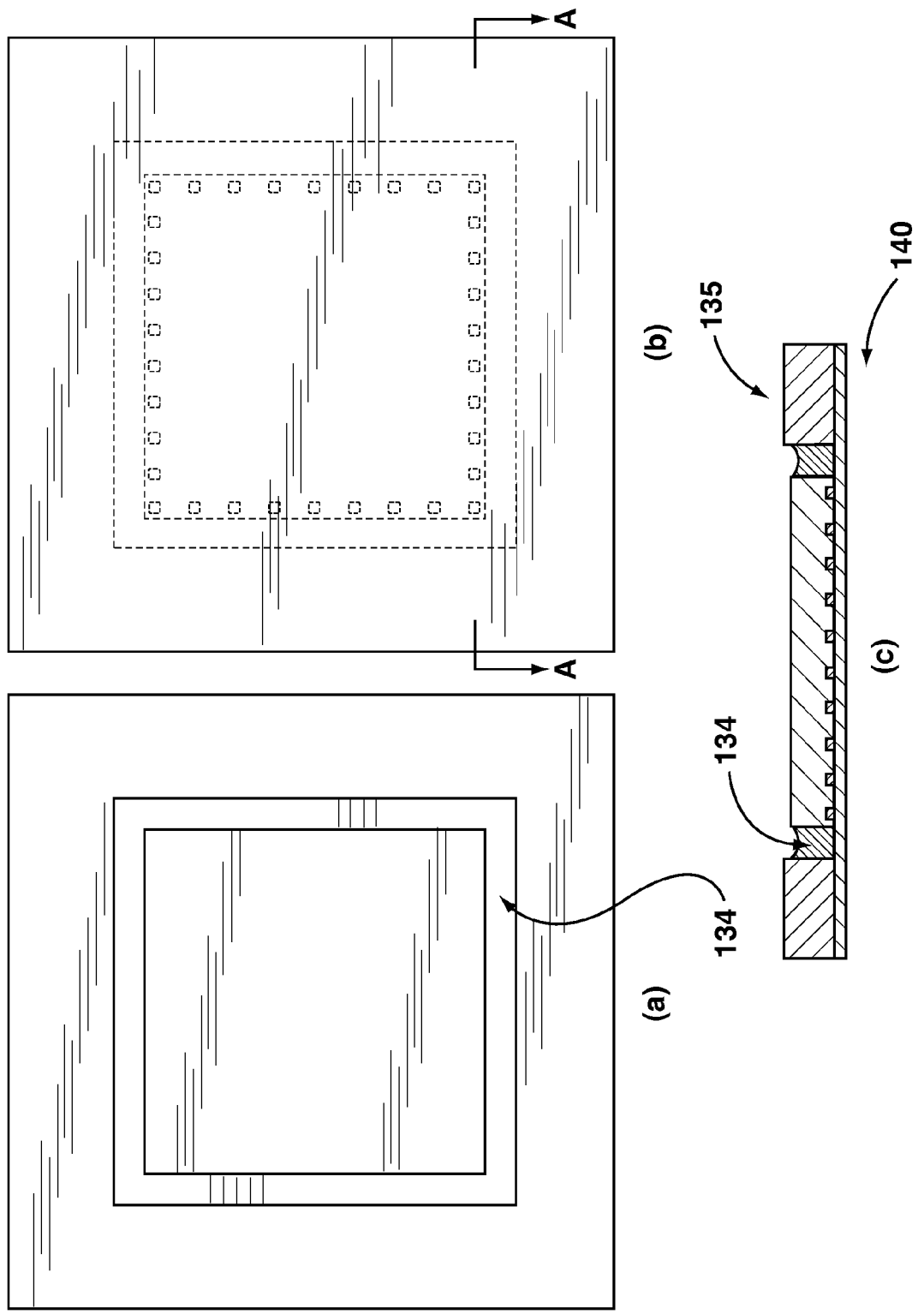
FIG. 27, comprising

Continuing with the illustrated embodiment and as shown in FIG. 14, underfill 134 can then be applied. FIG. 14(*a*) shows a top view of a repeating unit 125', FIG. 14(*b*) shows a bottom view of a repeating unit 125' and FIG. 14(*c*) shows a cross section of a repeating unit 125' along line A-A, having a top surface 135 and a bottom surface 140. Specifically, underfill can be applied to cavity 110 in a manner similar to the description above, of step 230 of method 200. The dispensed underfill material can then be cured through high temperature curing. In implementations where die 122 includes wire bond pads 124 and is directly bonded to tape 126, the underfill may be applied only to the gap between die 122 and the inner surface 111 as shown in FIG. 27.

Figure 15:
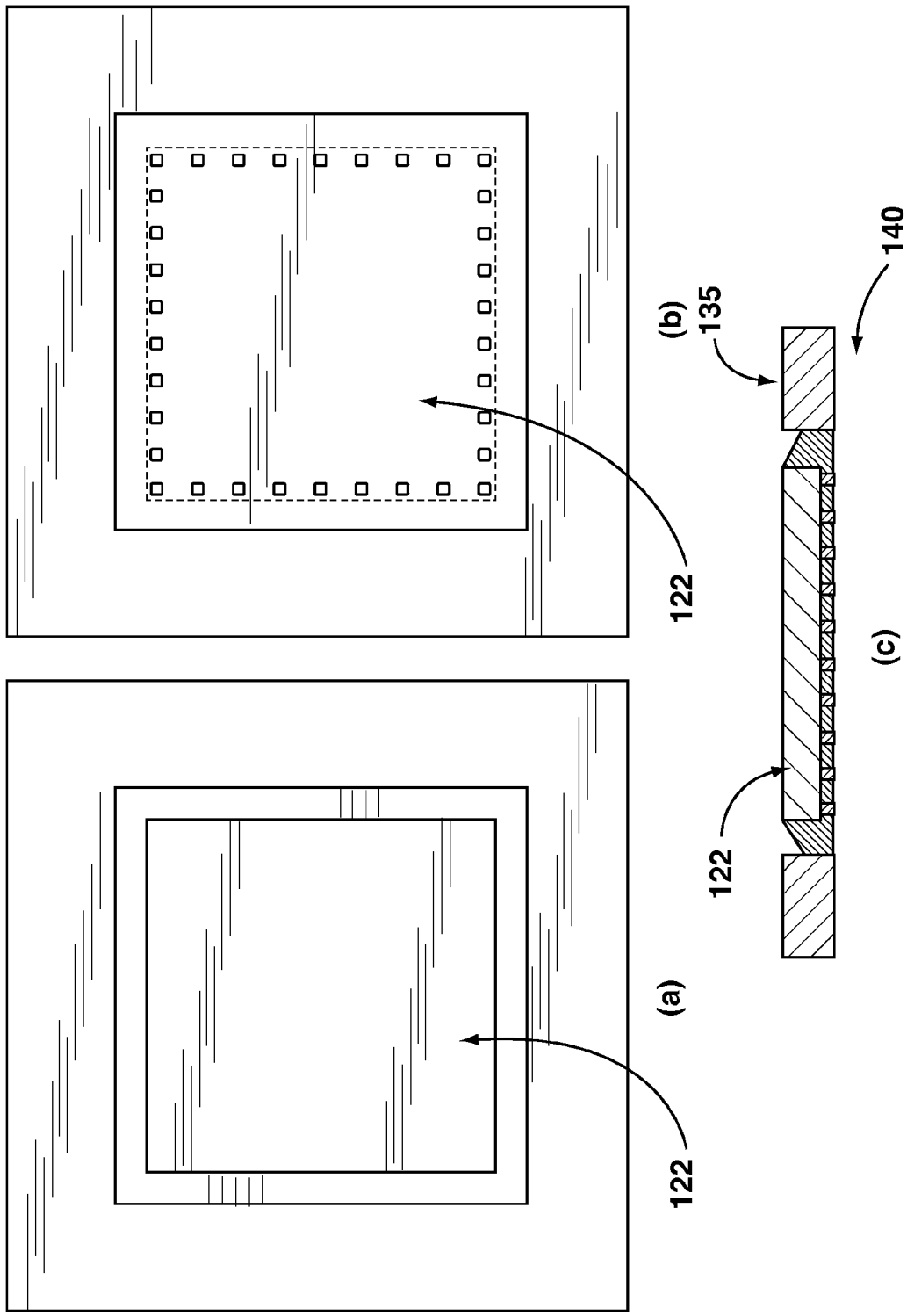
FIG. 15, comprising

After the curing has been completed, the high temperature resistance tape 106 can be removed, as shown in FIG. 15. Tape 106 can be removed, for example, by simple peeling.

Figure 16:
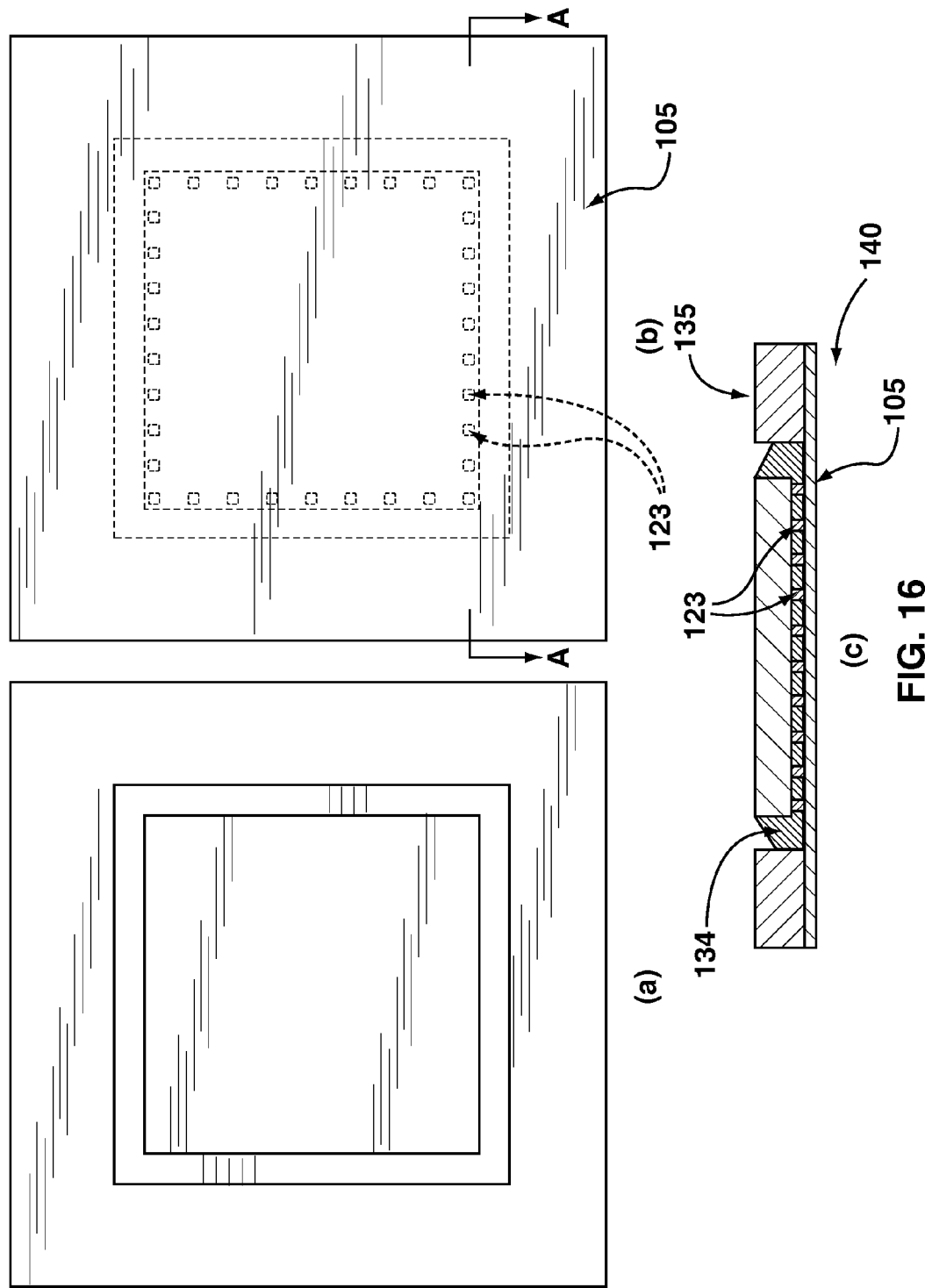
FIG. 16, comprising
Figure 28:
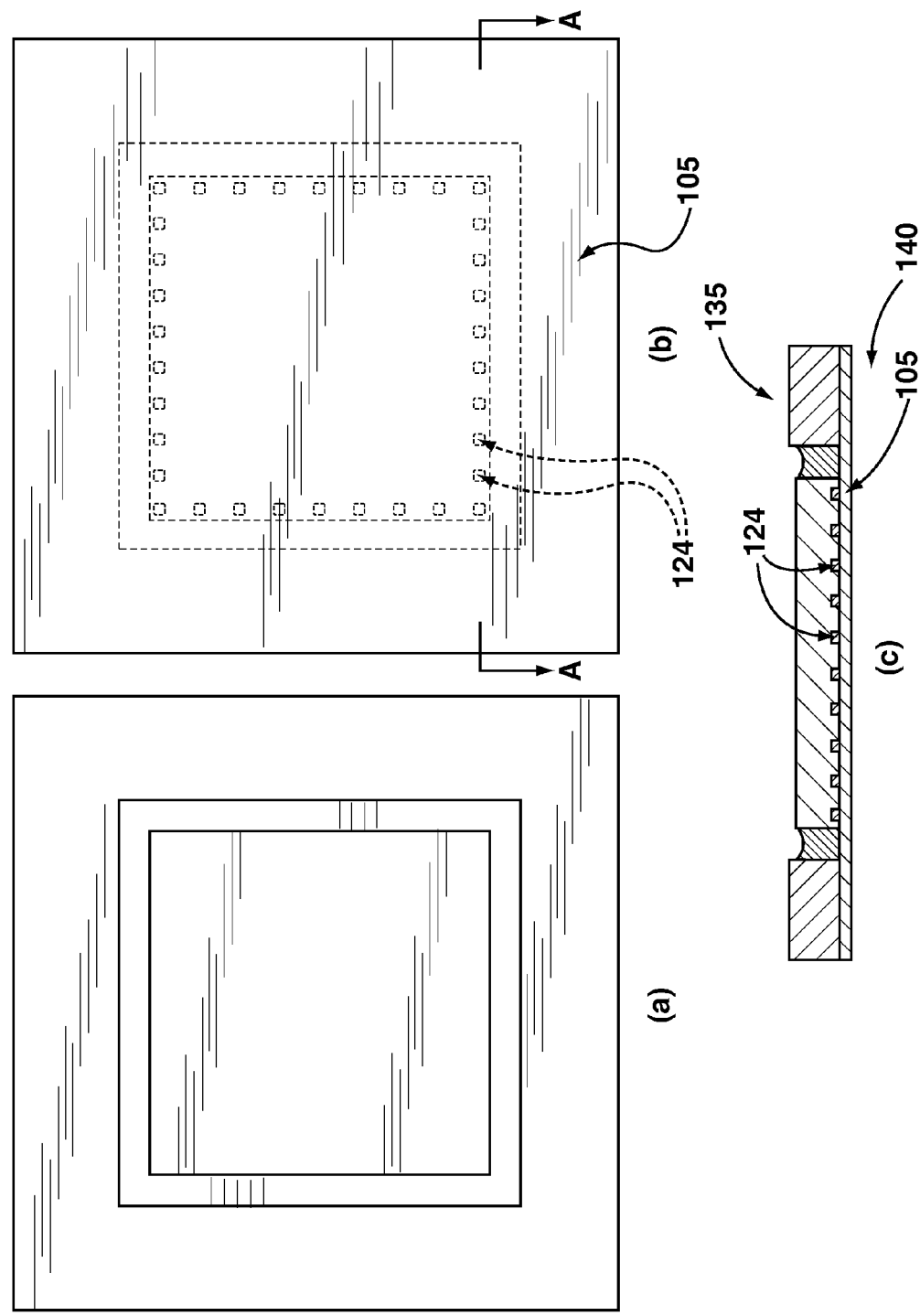
FIG. 28, comprising

After removing tape 106, bottom surface 140 of unit 125' can be metalized or fully plated as shown in FIG. 16, thus forming and combining conductive portion 105 with dielectric portion 120. FIG. 16(*a*) shows a top view of a repeating unit 125', FIG. 16(*b*) shows a bottom view of a repeating unit 125' and FIG. 16(*c*) shows a cross section of a repeating unit 125' along dashed line A-A, having a top surface 135 and a bottom surface 140. In some implementations, conductive portion 105 can be formed by metalizing the bottom surface 140 of the dielectric portion 120, bottom surface 140 of the underfill 134 and the exposed portions of joints 123. The metallization can be achieved by either sputtering a metal seed layer (such as copper or chromium or titanium) or by immersion metal plating using metals such as copper. The seed layer or the immersion plating can be followed by further electrolytic plating with copper or similar metals to achieve the required thickness. An alternative implementation of metallization using a die 122 with wire bond pads is shown in FIG. 28.

After the repeating unit 125' is metalized, it can first be optionally selectively plated, then selectively etched, then selectively passivated by selective application of solder resist and finally, solder can be applied, all carried out in the manner as described above in relation to steps 240 to 270 of method 200, for example.

Figure 17:
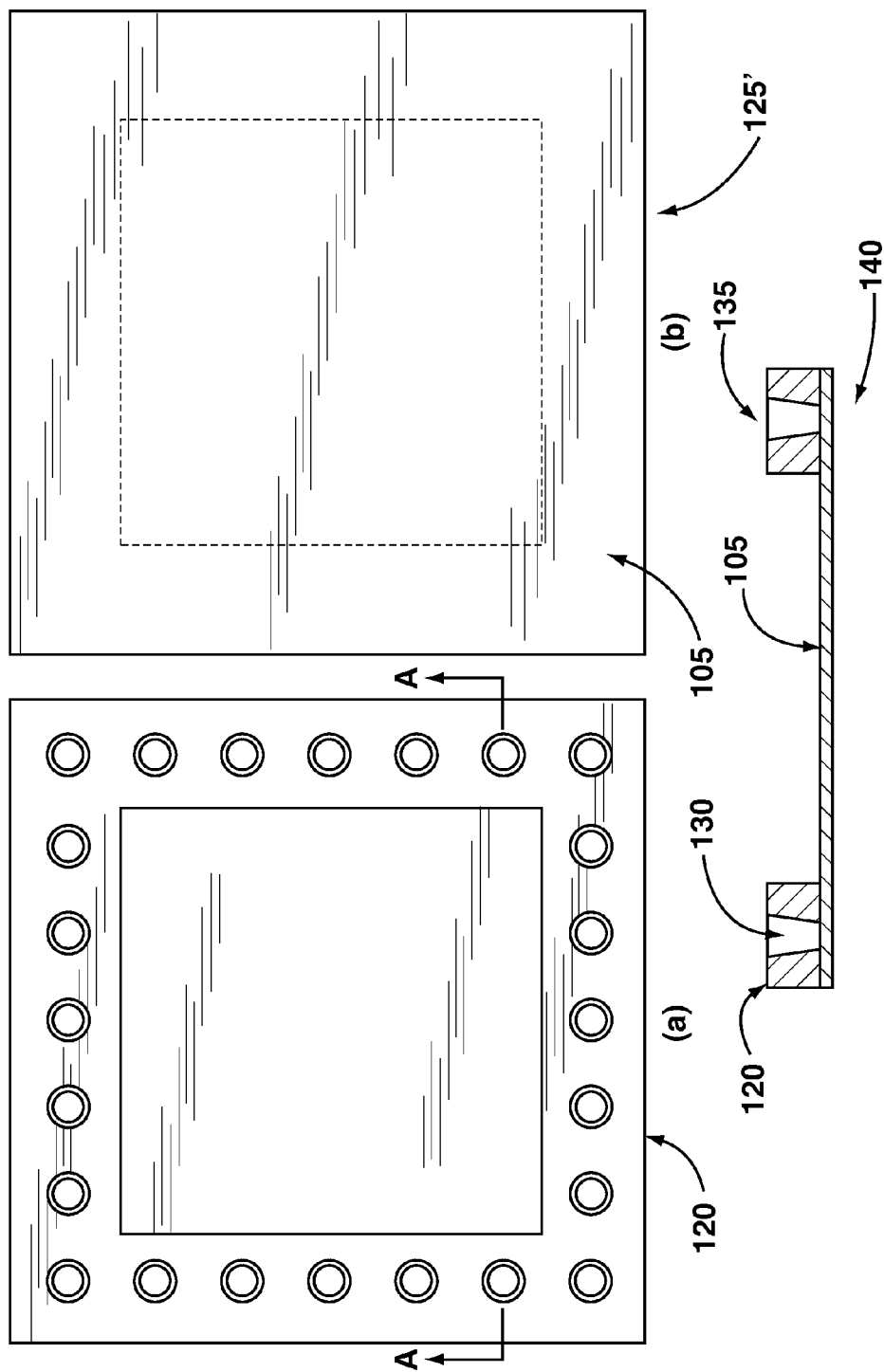
FIG. 17, comprising

In further variations of method 200, repeating units 125' of panel 101 can be molded to include cavities in addition to cavity 110. For example, as indicated in FIG. 17, contact cavities 130 can be included in dielectric portion 120 as formed by the molding process. Contact cavities 130, similar to cavity 110 can be formed in accordance with any predetermined shape desired. In this example, they are trapezoidal in cross section having a larger portal at the top surface 135 of dielectric portion 120. FIG. 17(*a*) shows a top view of a repeating unit 125', FIG. 17(*b*) shows a bottom view of a repeating unit 125' and FIG. 17(*c*) shows a cross section of a repeating unit 125' along line A-A, having a top surface 135 and a bottom surface 140.

Figure 18:
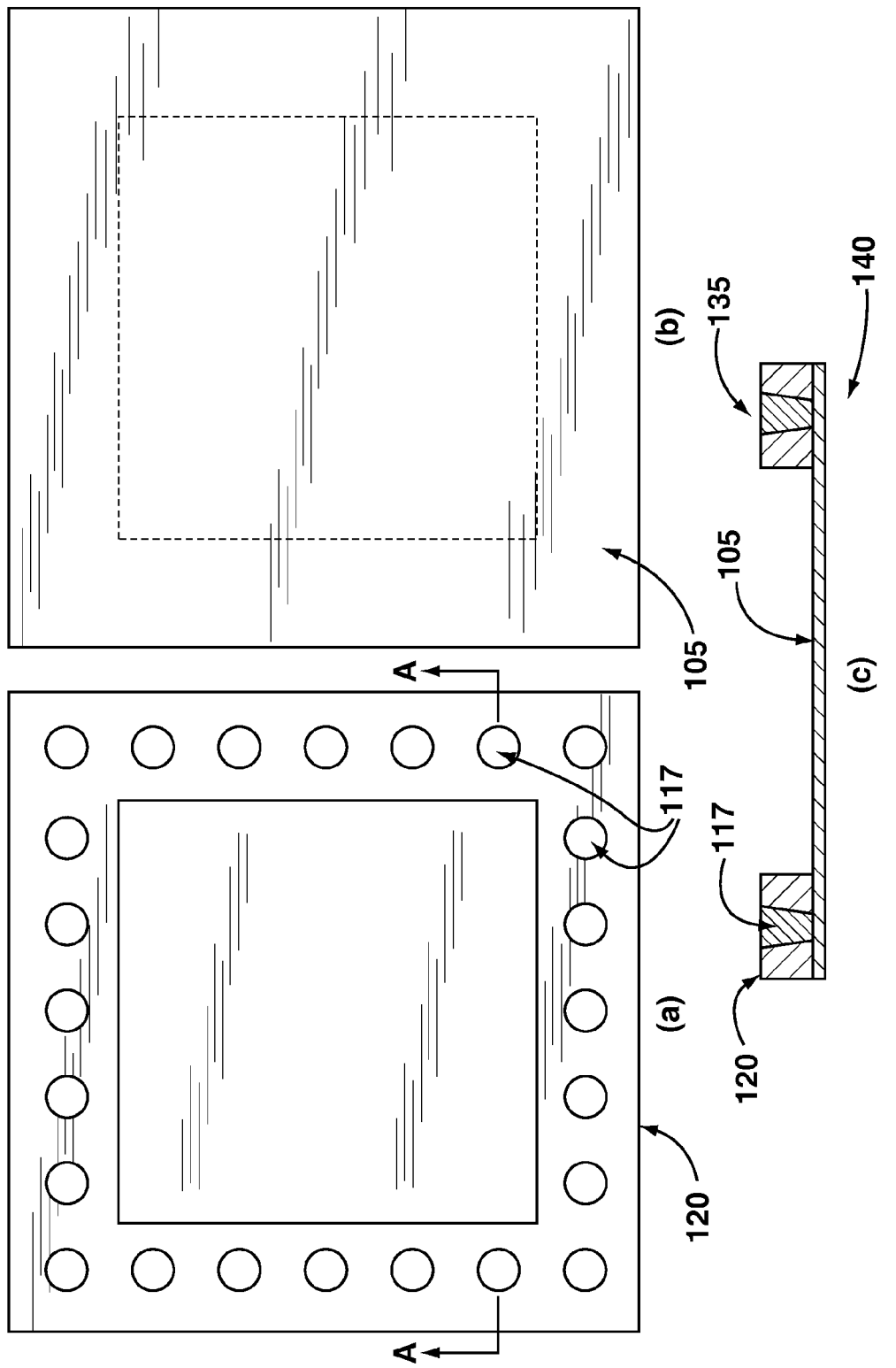
FIG. 18, comprising

As indicated in FIG. 18, contact cavities 130 can be filled with solder 117. FIG. 18(*a*) shows a top view of a repeating unit 125', FIG. 18(*b*) shows a bottom view of a repeating unit 125' and FIG. 18(*c*) shows a cross section of a repeating unit 125' along dashed line A-A, having a top surface 135 and a bottom surface 140.

Figure 19:
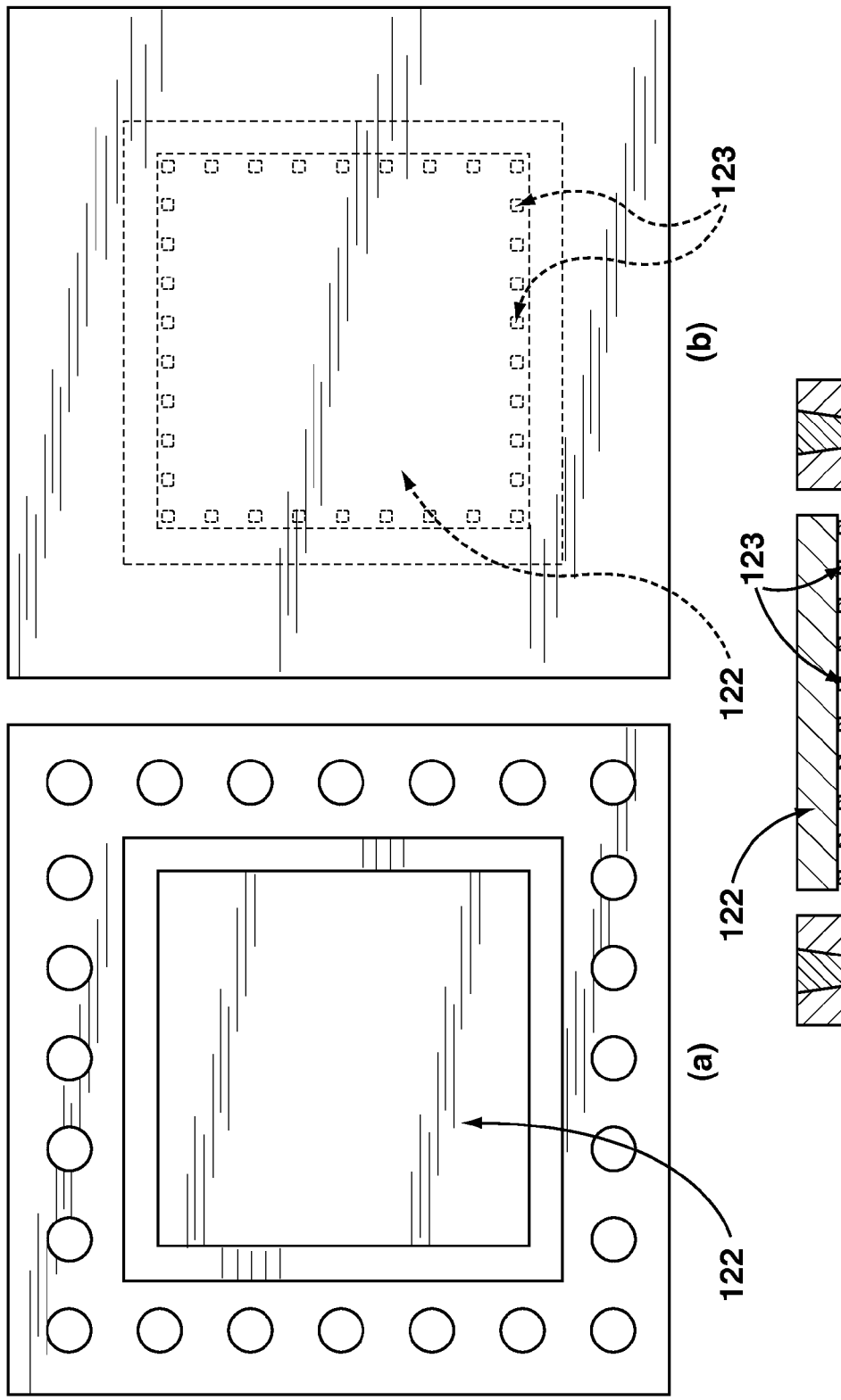
FIG. 19, comprising
Figure 20:
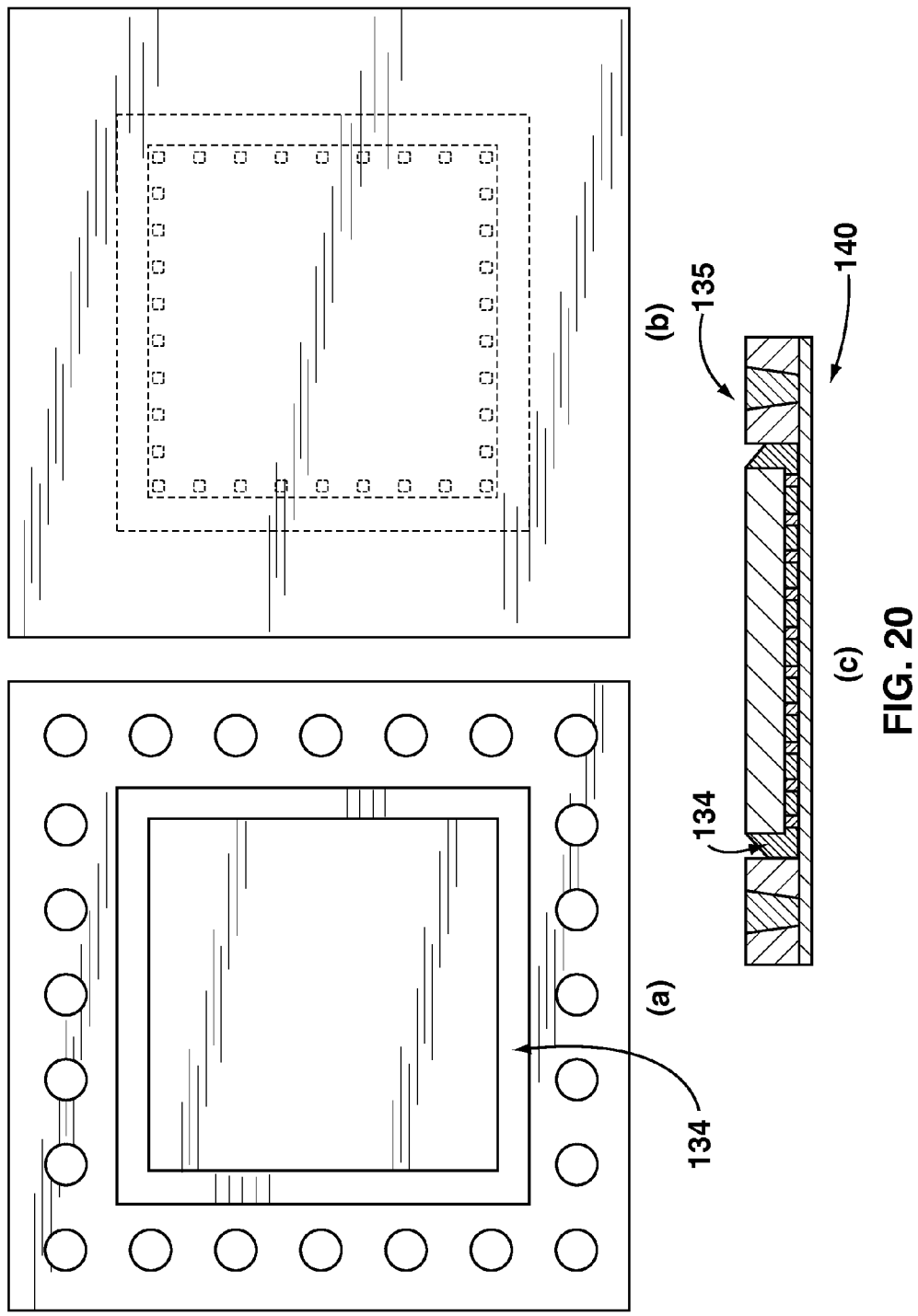
FIG. 20, comprising
Figure 21:
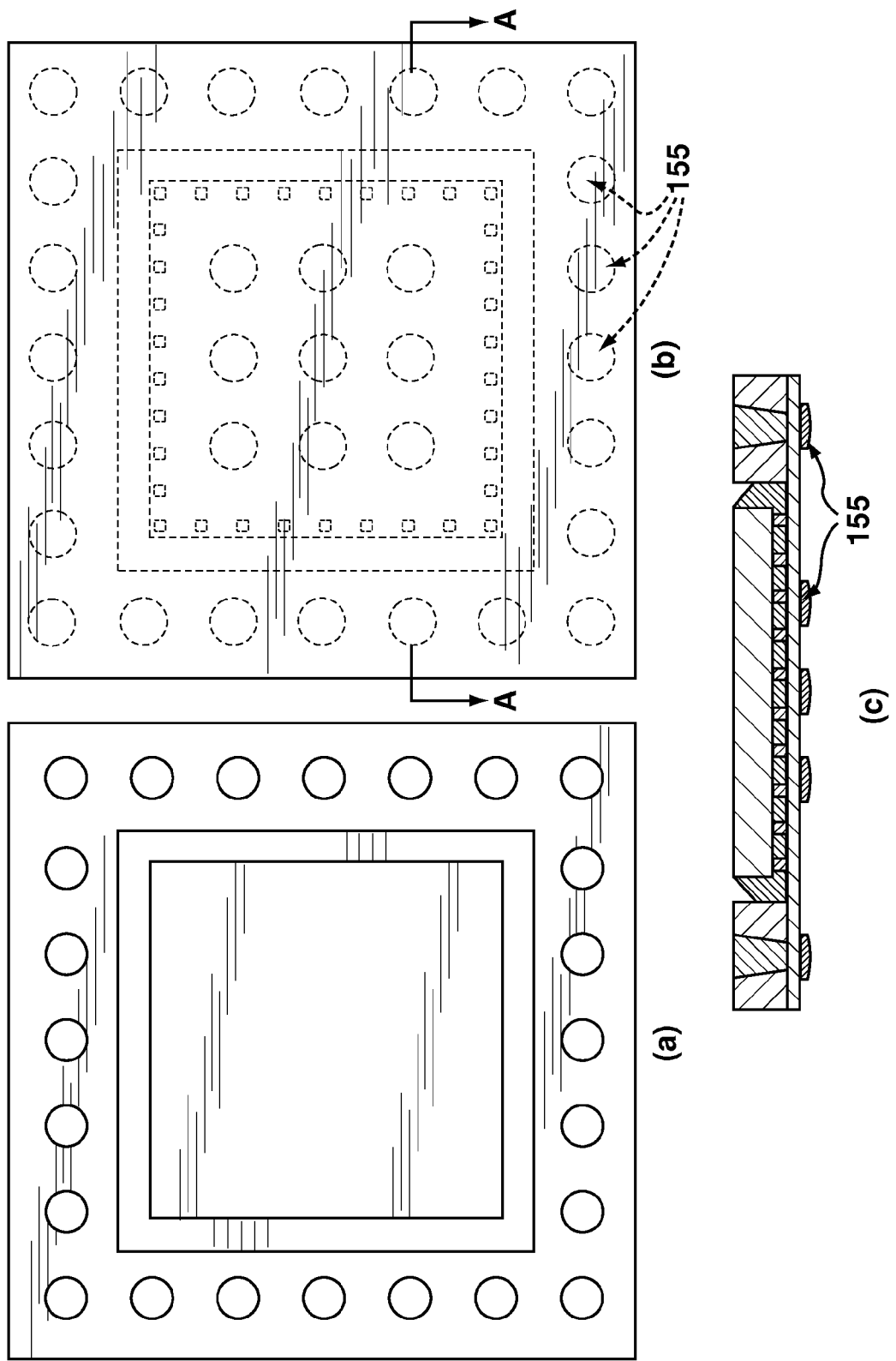
FIG. 21 shows a repeating unit of the panel in accordance with an implementation.
Figure 22:
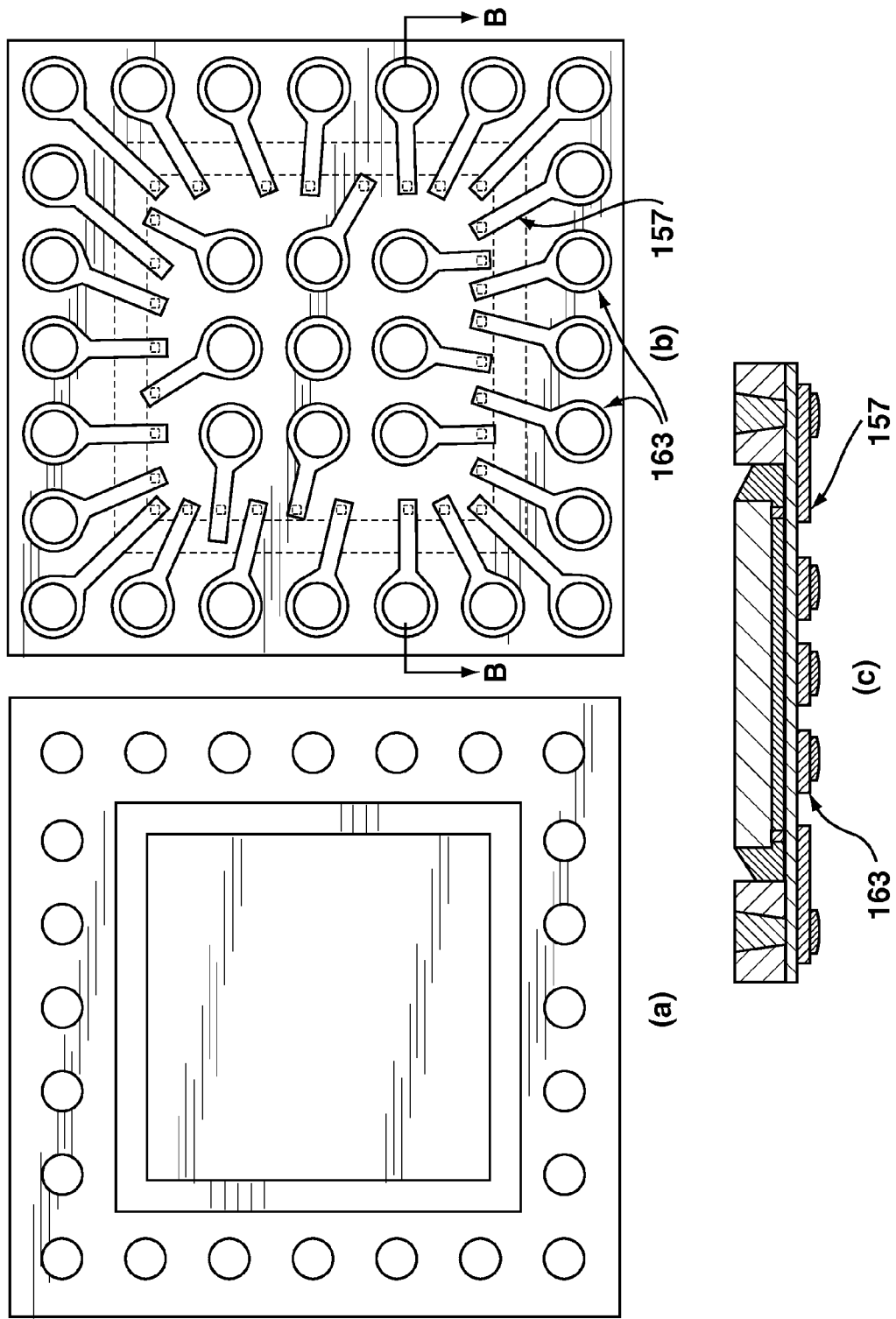
FIG. 22, comprising
Figure 23:
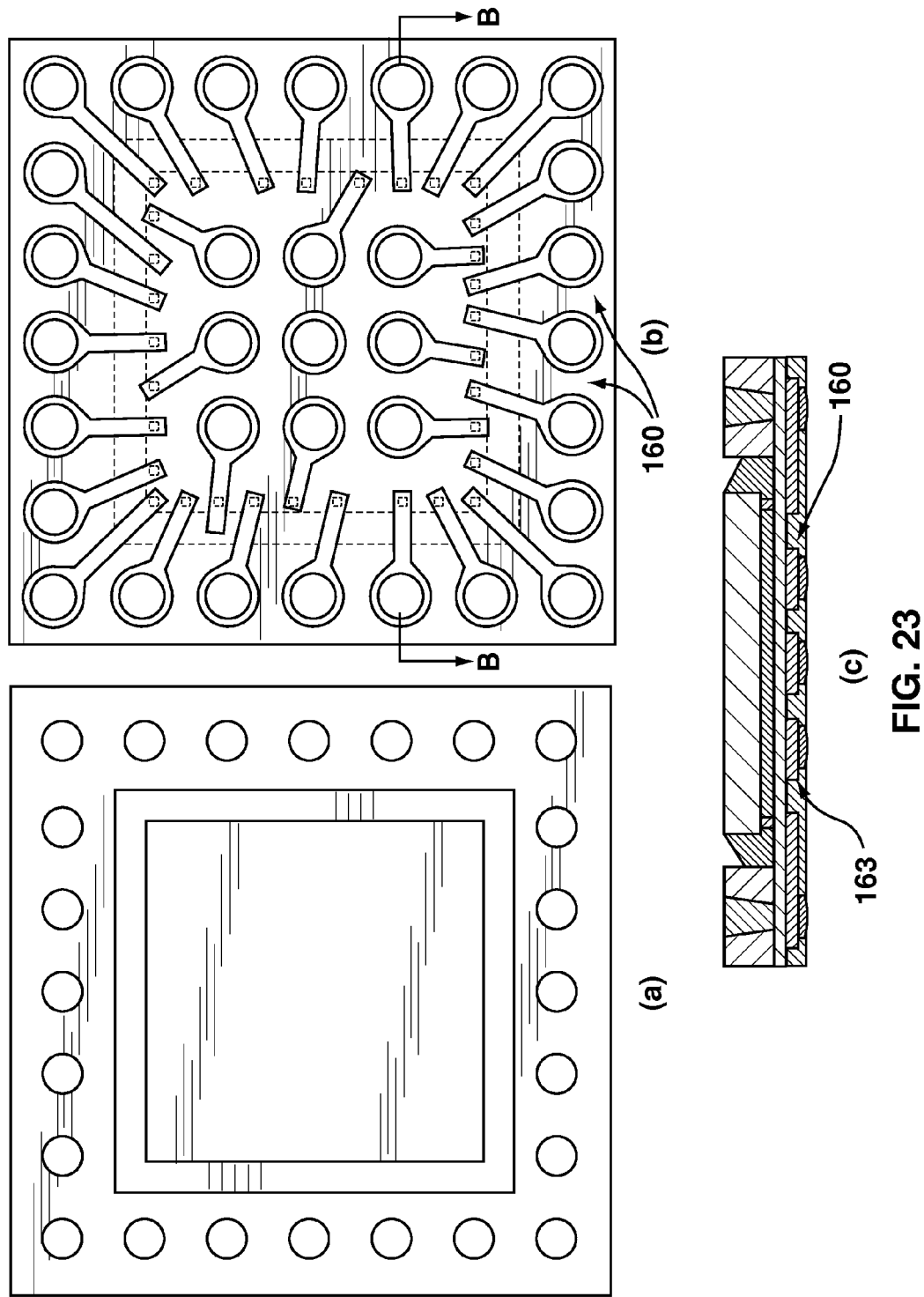
FIG. 23, comprising
Figure 24:
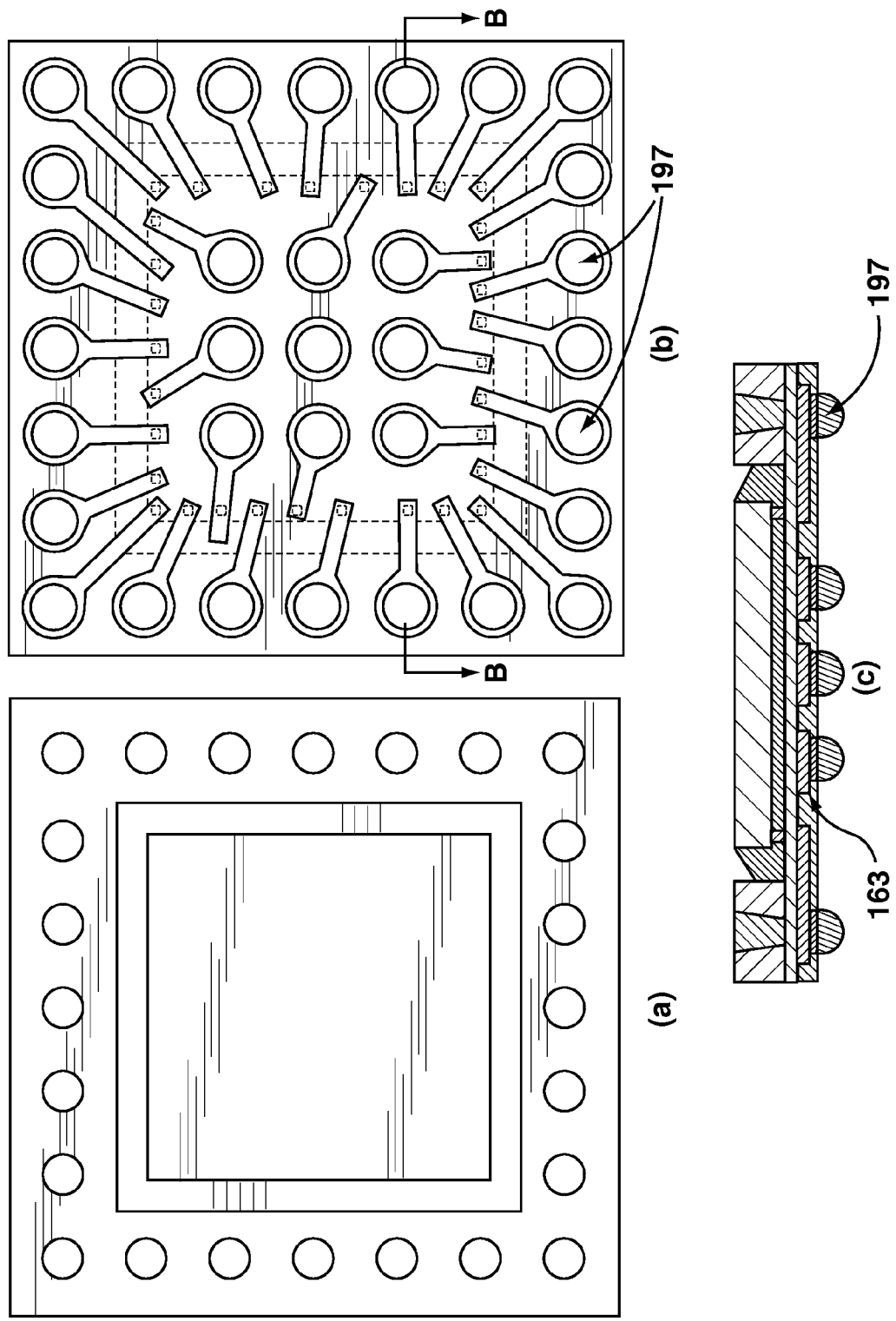
FIG. 24, comprising
Figure 29:
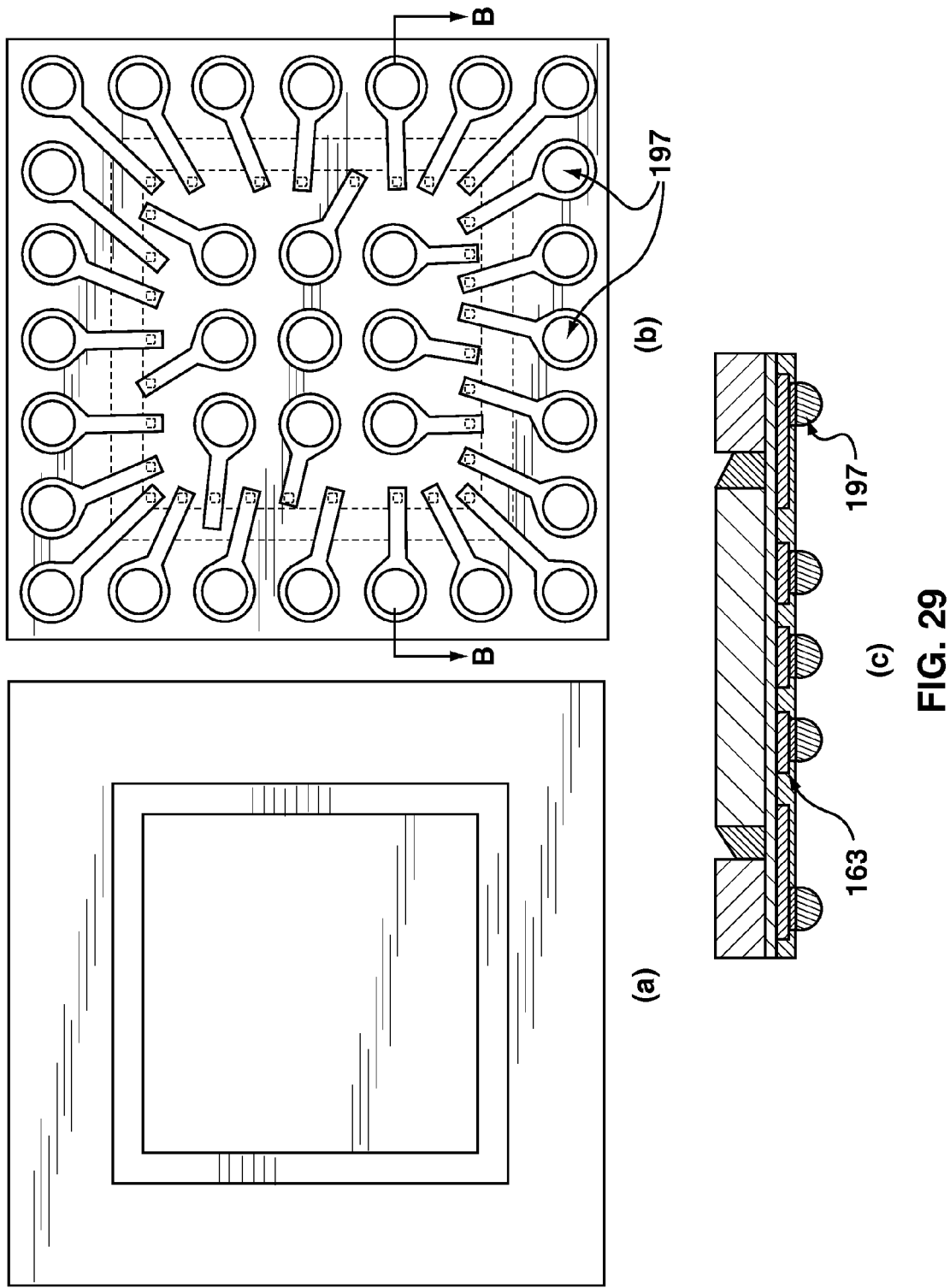
FIG. 29, comprising

A flip chip die 122 can then be attached to repeating unit 125', by bonding the chip to conductive portion 105 using flip chip joints 123 as shown in FIG. 19 and for example, as described in relation to step 220 of method 200. The unit 125' can then be underfilled, followed by temperature curing the underfill material, optionally metal plated, conductive portion selectively etched, solder resist and solder balls can be applied as shown in FIGS. 20 through 24 and discussed above in relation to steps 230 to 270 of method. 200. An implementation involving a die with wire bond pads is shown in FIG. 29.

Figure 25:
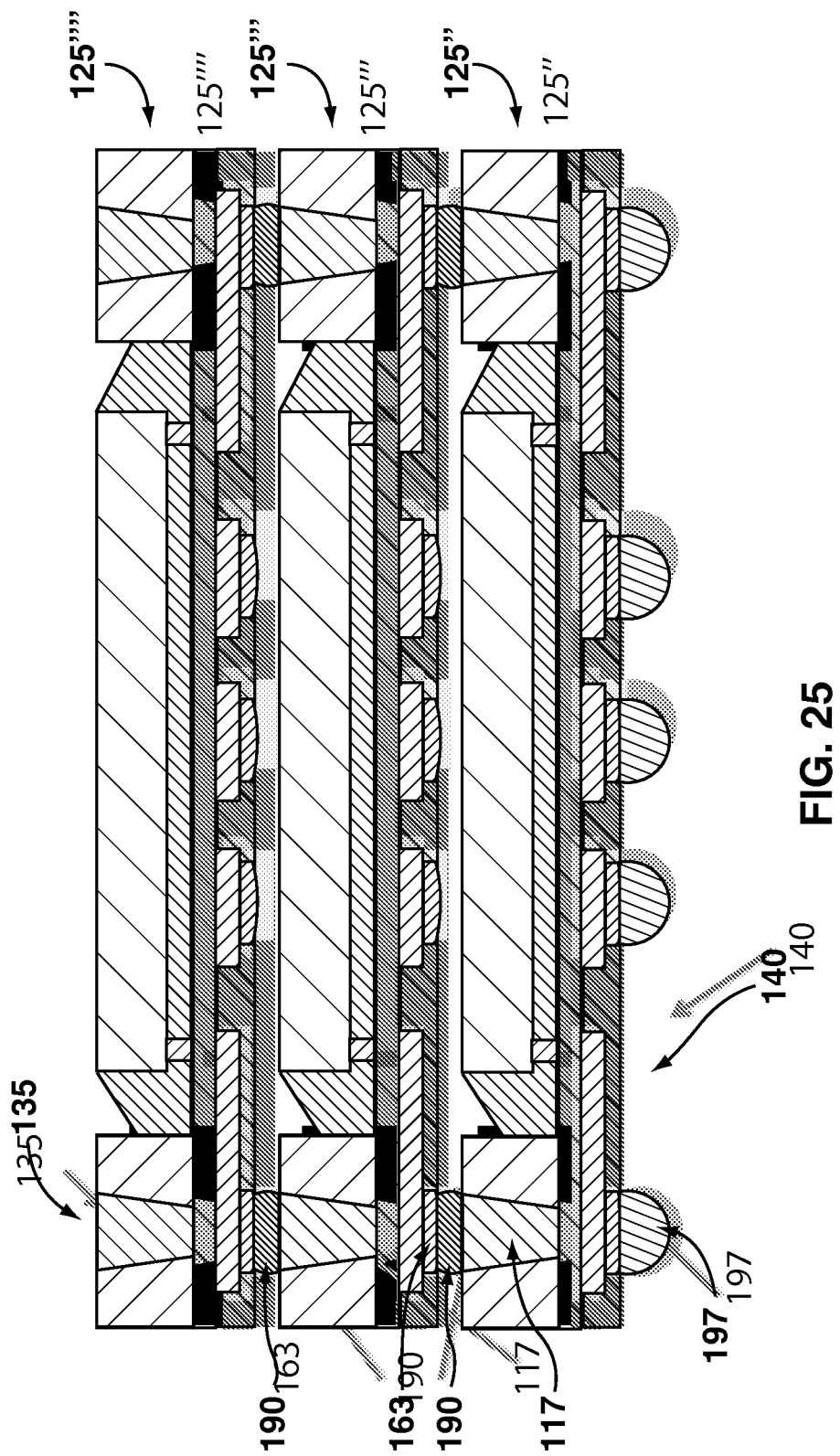
FIG. 25 shows cross-sectional view of stacked carriers in accordance with an implementation.

Referring now to FIG. 25, cross section of stacked carriers 125 is shown. Carrier 125" is bound to the carrier 125''' above it, via solder 190. Solder 190 is applied selectively to BGA ball pads of 125''' to be connected to one end to the portion of solder 117 of carrier 125" below it, exposed through the top portal of one or more contact cavities 130 of carrier 125". Solder 190 is applied, at the other end, to one or more exposed BGA pads 163 of carrier 125''' above it, this forming the bond between carrier 125" and 125'''. Similarly, carrier 125''' is bound to the carrier above it, carrier 125"", by applying solder 190 to the solder 117 exposed through the contact cavities 130 of 125''' so as to attach it to the exposed ball pads of carrier 125"". In variations, conductive epoxy can be used in place of solder 190 to bind two carriers 125. In further variations, solder balls can be applied to the solder ball pads at the bottom surface 140 of a carrier 125. The solder balls can then be soldered with the solder 117 of another carrier 125 immediately below it when the contact cavities 130 of the carrier 125 below are filled with solder 117. In yet further variations less than three or more than three carriers 125 can be stacked using this methodology.

It should be noted that although the above discussion of the variation of method 200 where contact cavities 130 are utilized is discussed in light of the use of a metal foil for conductive portion 105, in further variations, a tape 106 and metallization, as described above can also be used to form a carrier 125 with contact cavities and accordingly, stackable carriers. Other variations will now occur to a person of skill.

The above-described embodiments are intended to be examples and alterations and modifications may be effected thereto, by those of skill in the art, without departing from the scope which is defined solely by the claims appended hereto. For example, methods, systems and embodiments discussed can be varied and combined, in full or in part.

I claim:

1. A method of fabricating a BGA carrier, the method comprising:
   combining a conductive portion and a molded dielectric portion, the dielectric portion including a top surface, a bottom surface and an inner surface, the inner surface intersecting said top surface and said bottom surface, the inner surface forming a cavity for receiving a semiconductor die;
   selectively bonding the semiconductor die to a top surface of the conductive portion via a plurality of flip chip joints at locations on a bottom surface of the semiconductor die located within the cavity;
   selectively etching part of the conductive portion to form connection paths; and
   applying solder resist selectively to a bottom surface of the conductive portion in accordance with a predetermined shape to define areas of the conductive portion as BGA pads exposed at the bottom surface of the conductive portion; wherein
   the BGA pads include at least one first BGA pad exposed at the bottom surface of the conductive portion in a portion located within the cavity;
   the BGA pads include at least one second BGA pad exposed at the bottom surface of the conductive portion in a portion located outside of the cavity; and
   the connection paths join the flip chip joints to the at least one first BGA pad at the locations on the bottom surface of the semiconductor die located within the cavity.

2. The method of claim 1, wherein the dielectric portion is molded from a polymerized molding compound.

3. The method of claim 2, wherein the polymerized molding compound comprises a binding material.

4. The method of claim 3, wherein the binding material comprises an epoxy filled with inorganic fillers.

5. The method of claim 4, wherein the inorganic fillers comprise one of either at least one of silicon dioxide or silicon carbide, or a plastic compound.

6. The method of claim 1, wherein the inner surface of the dielectric portion orthogonally intersects the top surface and the bottom surface of the dielectric portion.

7. The method of claim 1, wherein the inner surface of the dielectric portion non-orthogonally intersects the top surface and the bottom surface of the dielectric portion.

8. The method of claim 1, wherein the shape of the cavity is one of either a square, a rectangle, a triangle, a circle or an irregular shape.

9. The method of claim 1, further comprising selectively plating an exposed portion of the bottom surface of the conductive portion.

10. The method of claim 9, wherein the selective plating is shaped to form the BGA pads.

11. The method of claim 9, wherein the selective plating comprises applying a photo-imagable plating resist to the bottom surface of the conductive portion, exposing the photo-imagable plating resist to an image pattern, developing the plating resist, depositing metal on unexposed portions of the plating resist, and stripping the plating resist.

12. The method of claim 11, wherein the metal is one of either Ag, Ni/Au or Pd.

13. The method of claim 9, wherein selectively etching comprises applying a photo-imagable etching resist to the bottom surface of the conductive portion, exposing the photo-imagable etching resist to an image pattern, developing the etching resist, and stripping the etching resist.

14. The method of claim 10 wherein the dielectric portion includes a plurality of contact cavities.

15. The method of claim 14 further comprising filling the contact cavities with solder, each contact cavity solder electrically in contact with one of the BGA pads.

16. The method of claim 15 further comprising connecting the contact cavity solder exposed through the top surface of the dielectric portion with the BGA pads of a second BGA carrier to stack the two BGA carriers.

17. The method of claim 1 further comprising dispensing an underfill between the die, the inner surface of the dielectric portion and the conductive portion.

18. A BGA carrier fabricated according to the method of claim 1.

19. The method of claim 1, further including attaching solder balls to the BGA pads using flux followed by reflow.

20. A method of fabricating a BGA carrier, the method comprising:
   combining a conductive portion and a molded dielectric portion, the dielectric portion including a top surface, a bottom surface and an inner surface, the inner surface intersecting said top surface and said bottom surface, the inner surface forming a cavity for receiving a semiconductor die;
   selectively bonding the semiconductor die to a top surface of the conductive portion via a plurality of flip chip joints at locations on a bottom surface of the semiconductor die located within the cavity;
   selectively etching part of the conductive portion to form connection paths; and
   applying solder resist selectively to a bottom surface of the conductive portion in accordance with a predetermined shape to define areas of the conductive portion as BGA pads exposed at the bottom surface of the conductive portion; wherein
   the BGA pads include at least one first BGA pad exposed at the bottom surface of the conductive portion in a portion located within the cavity;
   the BGA pads include at least one second BGA pad exposed at the bottom surface of the conductive portion in a portion located outside of the cavity;
   the connection paths join the flip chip joints to the at least one first BGA pad; at the locations on the bottom surface of the semiconductor die located within the cavity; and
   selectively bonding the semiconductor die to a top surface of the conductive portion further comprises:
      applying an adhesive layer to the bottom surface of the dielectric portion;
      temporarily bonding the die to a top surface of the adhesive layer within the cavity;
      dispensing an underfill between the die, the inner surface of the dielectric portion and the adhesive layer; and
      removing the adhesive layer, and wherein
   combining a conductive portion and a molded dielectric portion further comprises:
      metalizing the bottom surface of the molded dielectric portion and a bottom surface of the underfill to form the conductive portion.

21. The method of claim 20, further comprising and curing the underfill.

22. The method of claim 20, wherein the adhesive layer comprises one of either a thermoset epoxy or film.

23. The method of claim 20, further including applying a heat spreader to the adhesive layer.

24. The method of claim 20 wherein metalizing comprises one of sputtering a metal seed layer and immersion metal plating.

25. The method of claim 24 further comprising selectively plating the bottom surface of the conductive portion following the metallization.

26. A BGA carrier fabricated according to the method of claim 20.

* * * * *